US011508456B2

(12) United States Patent
Ryu et al.

(10) Patent No.: US 11,508,456 B2
(45) Date of Patent: Nov. 22, 2022

(54) SEMICONDUCTOR MEMORY DEVICE CAPABLE OF INCREASING FLEXIBILITY OF A COLUMN REPAIR OPERATION

(71) Applicant: SAMSUNG ELECTRONICS CO., LTD., Suwon-si (KR)

(72) Inventors: Yesin Ryu, Suwon-si (KR); Taewon Kim, Suwon-si (KR); Yoonna Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 453 days.

(21) Appl. No.: 16/685,458

(22) Filed: Nov. 15, 2019

(65) Prior Publication Data

US 2020/0365226 A1  Nov. 19, 2020

(30) Foreign Application Priority Data

May 15, 2019  (KR) ........................ 10-2019-0056832

(51) Int. Cl.
```
G11C 8/00        (2006.01)
G11C 29/44       (2006.01)
G11C 11/4096     (2006.01)
G06F 13/40       (2006.01)
G11C 11/4091     (2006.01)
G11C 11/408      (2006.01)
```
(52) U.S. Cl.
CPC ...... *G11C 29/4401* (2013.01); *G06F 13/4022* (2013.01); *G11C 11/4087* (2013.01); *G11C 11/4091* (2013.01); *G11C 11/4096* (2013.01)

(58) Field of Classification Search
CPC ............ G11C 29/4401; G11C 11/4087; G11C 11/4091; G11C 11/4096; G11C 11/4097; G11C 2029/1204; G11C 29/76; G11C 29/1201; G11C 29/44; G11C 11/4094; G06F 13/4022
See application file for complete search history.

(56) References Cited

U.S. PATENT DOCUMENTS

| | | | | |
|---|---|---|---|---|
| 6,151,263 A * | 11/2000 | Kyung | ................. | G11C 29/848 365/230.03 |
| 7,002,858 B2 | 2/2006 | Lee | | |
| 7,295,454 B2 | 11/2007 | Park et al. | | |
| 7,817,491 B2 | 10/2010 | Kwak | | |
| 7,916,558 B2 | 3/2011 | Do | | |
| 7,965,566 B2 | 6/2011 | Chi | | |

(Continued)

*Primary Examiner* — Mushfique Siddique
(74) *Attorney, Agent, or Firm* — F. Chau & Associates, LLC

(57) ABSTRACT

A semiconductor memory device includes a memory cell array, a bit-line switch, a block switch, and a column decoder. The memory cell array includes memory blocks coupled to at least one word-line and each of the memory blocks includes memory cells. The bit-line switch is connected between a first half local input/output (I/O) line of a first memory block and a second half local I/O line of the first memory block. The block switch is connected between the second half local I/O line of the first memory block and a first half local I/O line of a second memory block adjacent to the first memory block. The column decoder includes a repair circuit that controls connections by applying a first switching control signal to the bit-line switch and a second switching control signal to the block switch.

14 Claims, 31 Drawing Sheets

(56) References Cited

U.S. PATENT DOCUMENTS

| | | | |
|---|---|---|---|
| 8,547,779 B2 | 10/2013 | Hsu et al. | |
| 8,964,494 B2 | 2/2015 | Lane et al. | |
| 9,152,674 B2 | 10/2015 | Glover et al. | |
| 11,094,390 B2* | 8/2021 | Kim | G11C 29/42 |
| 2002/0109154 A1* | 8/2002 | Lee | G11C 29/808 257/200 |
| 2005/0018511 A1* | 1/2005 | Lee | G11C 11/4097 365/207 |
| 2006/0028900 A1* | 2/2006 | Shin | G11C 29/846 365/230.06 |
| 2018/0067847 A1* | 3/2018 | Oh | G06F 11/1048 |
| 2019/0096508 A1* | 3/2019 | Kim | G11C 29/787 |
| 2019/0348140 A1* | 11/2019 | Cho | G11C 29/44 |

* cited by examiner

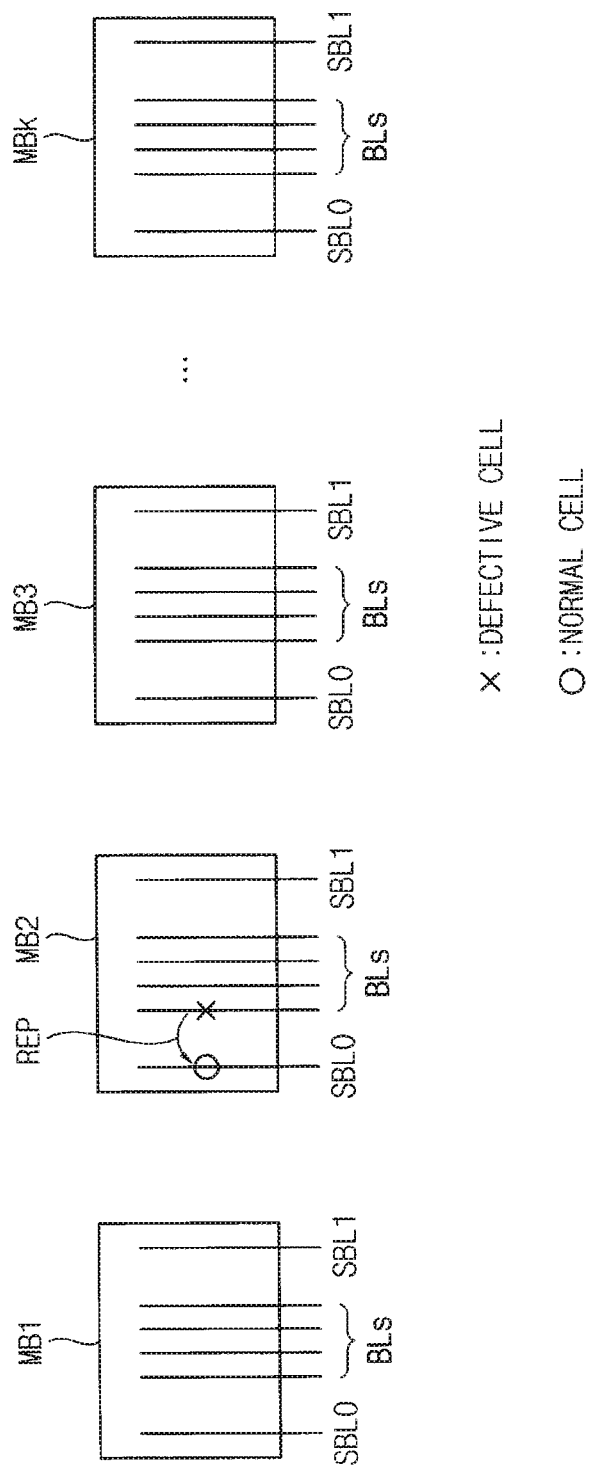

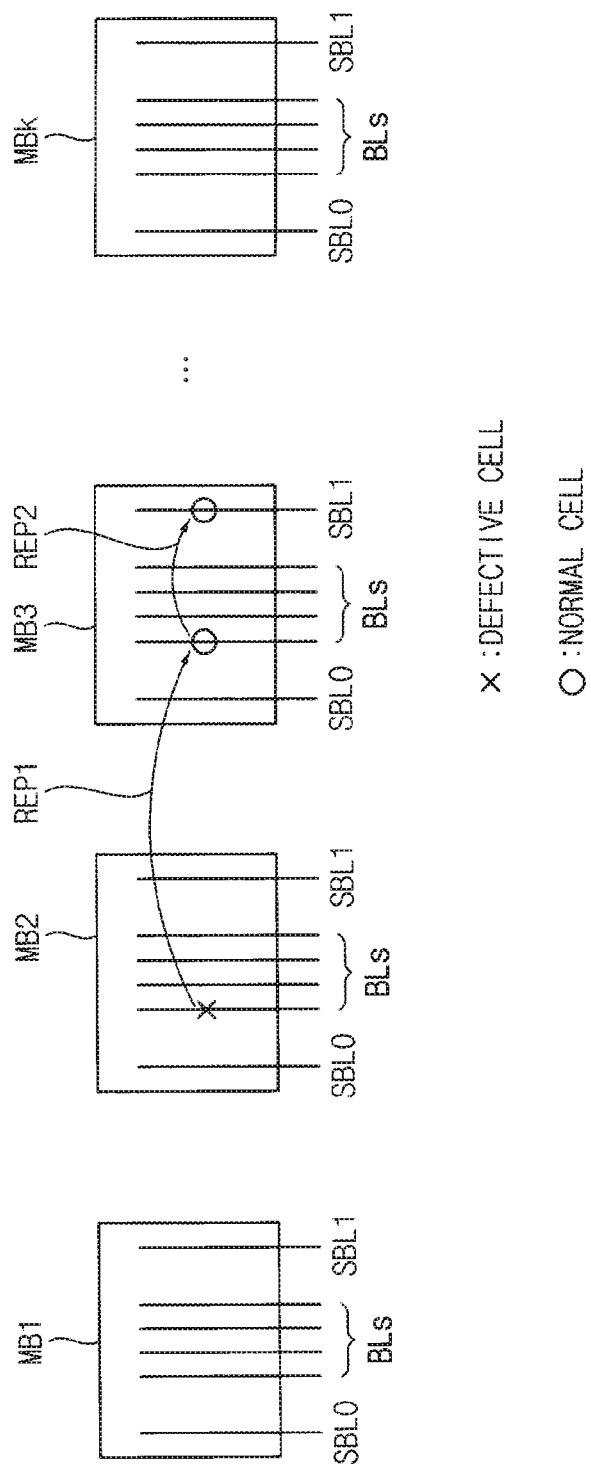

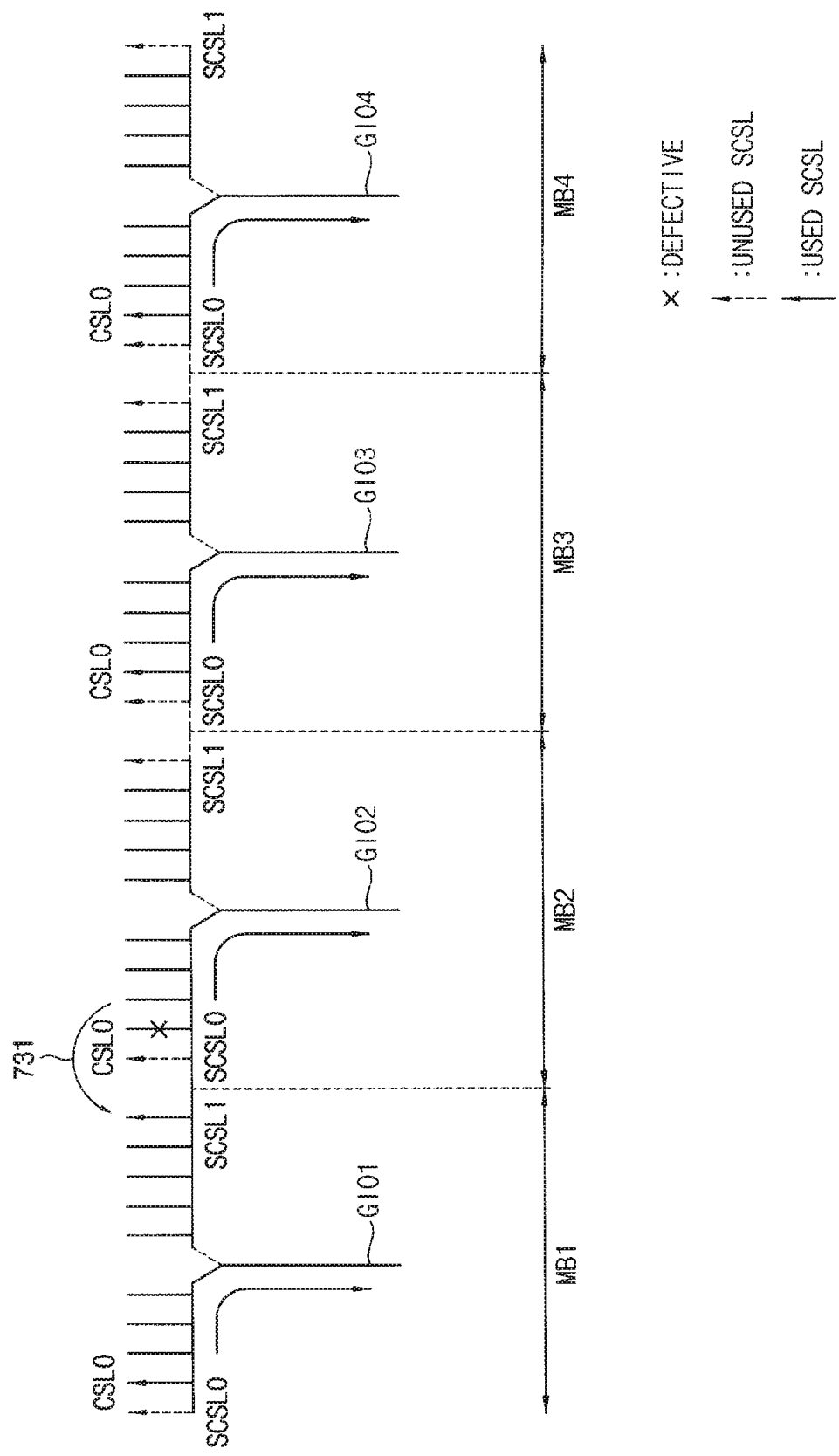

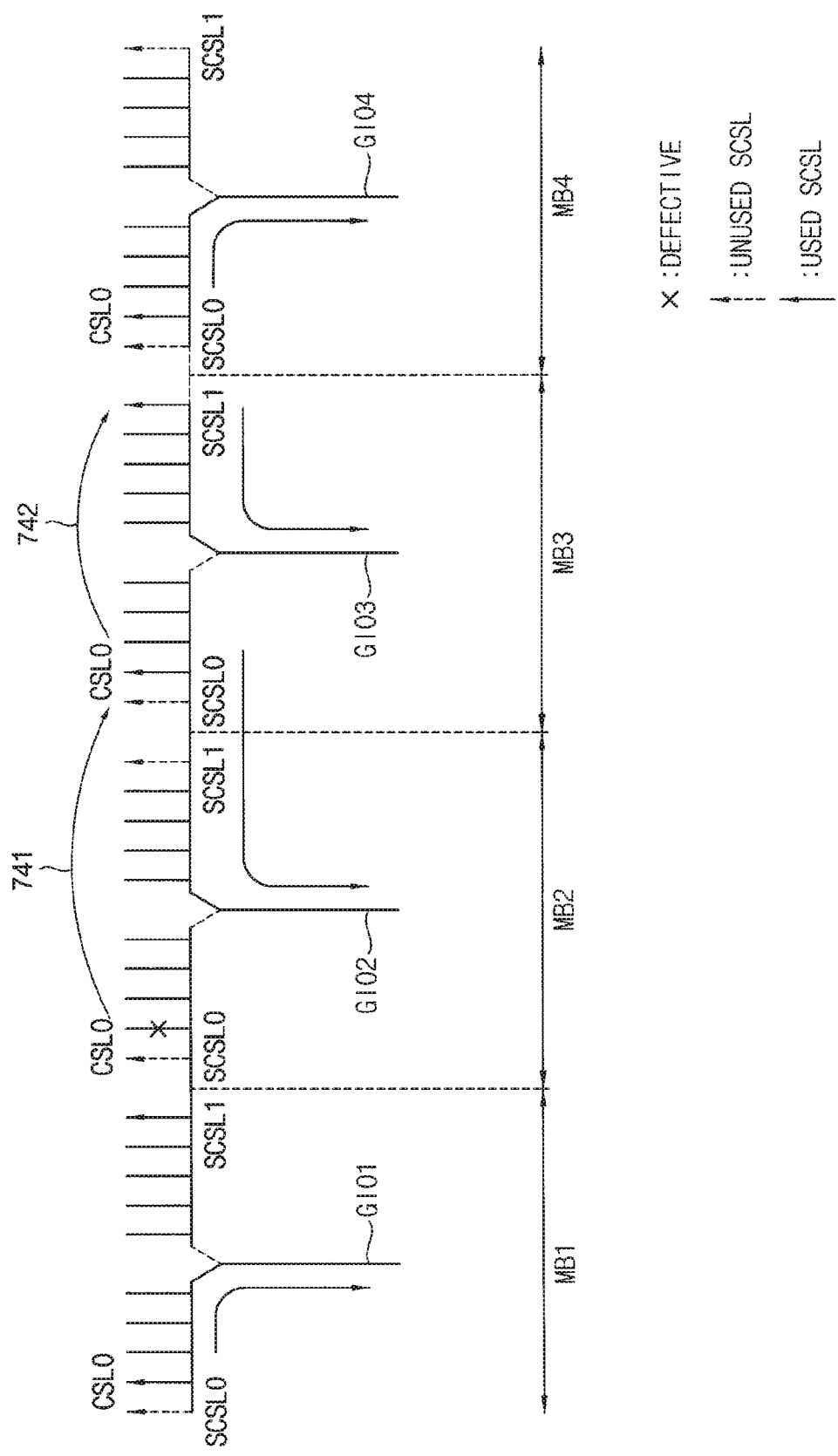

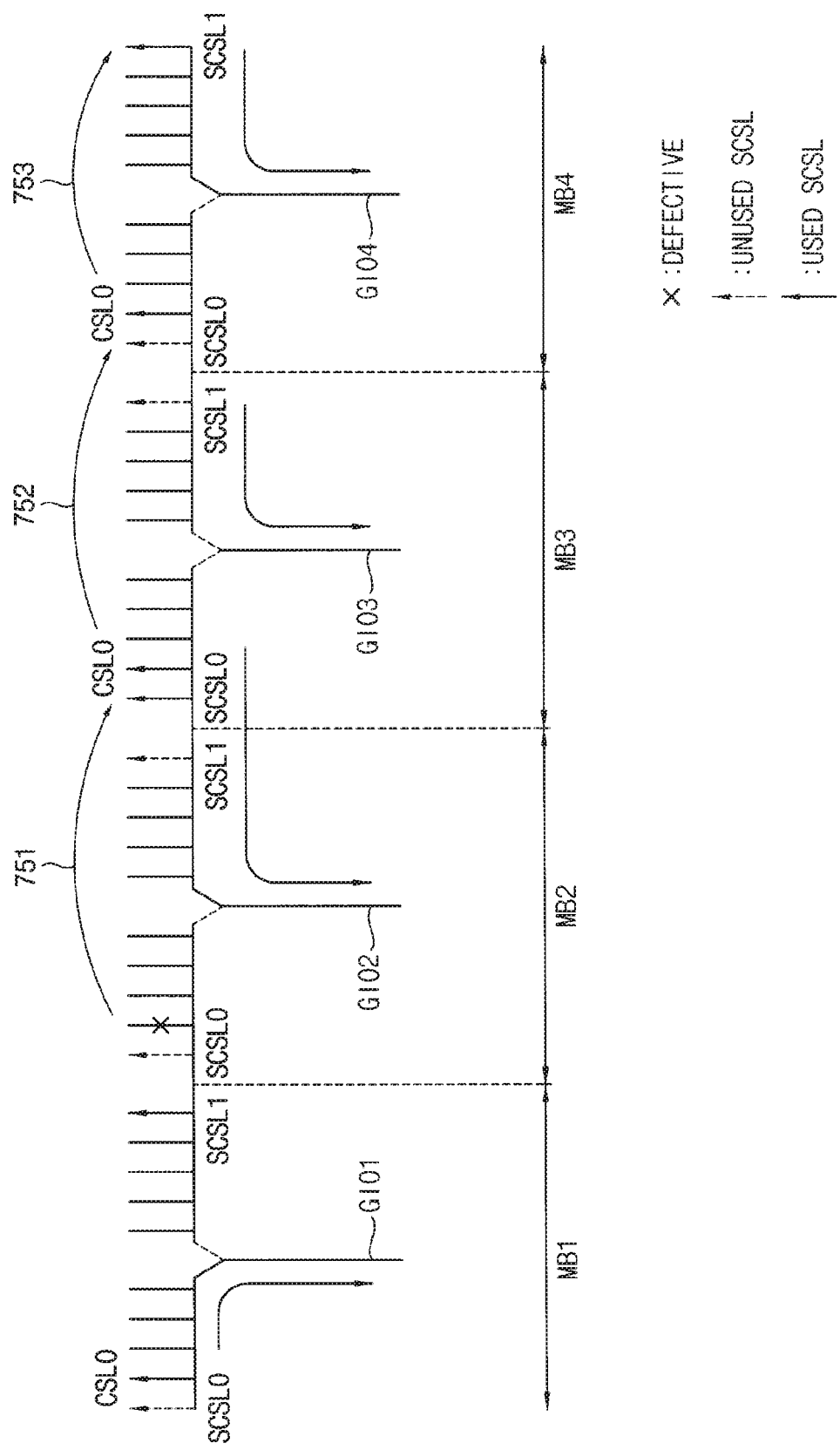

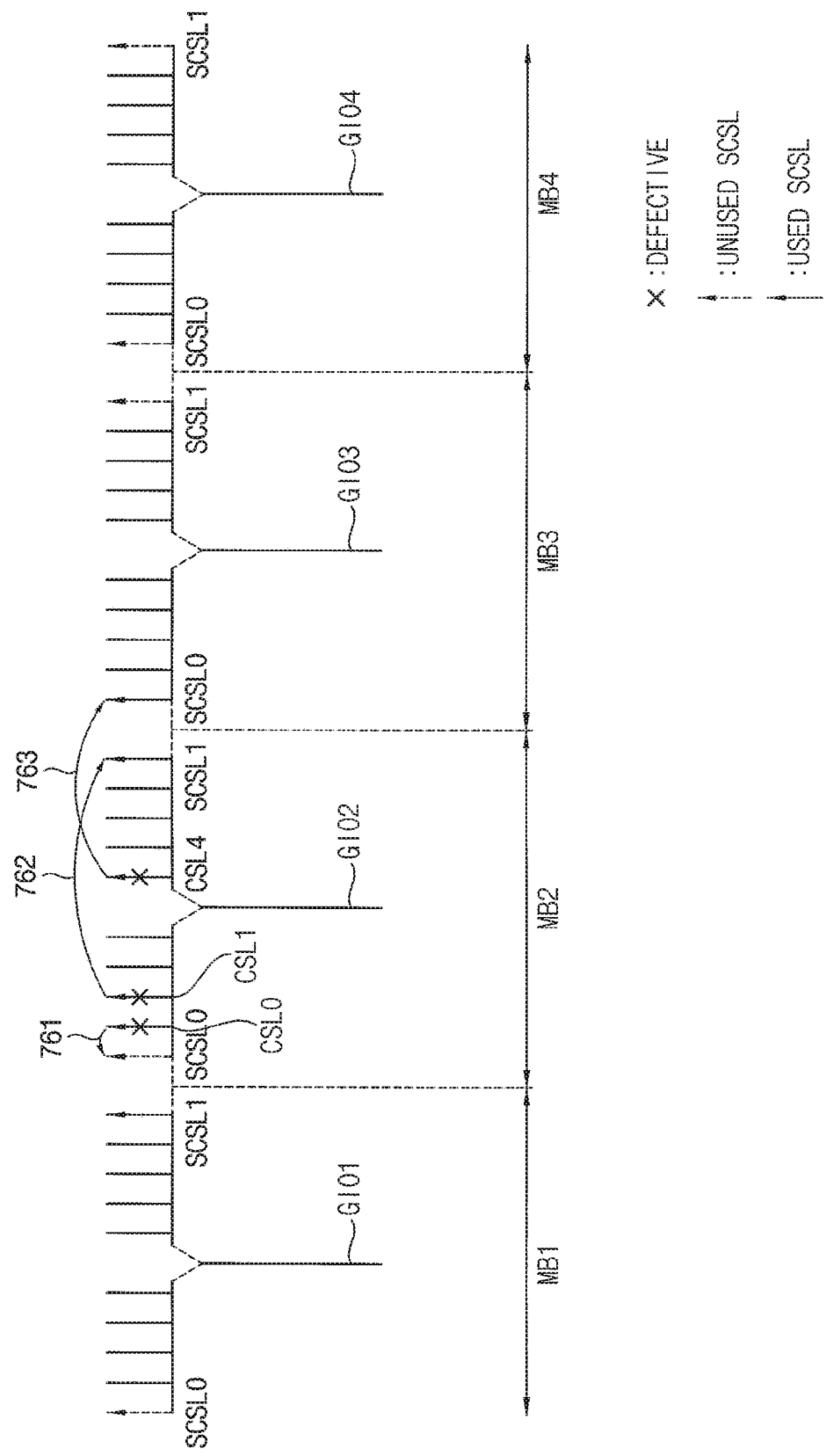

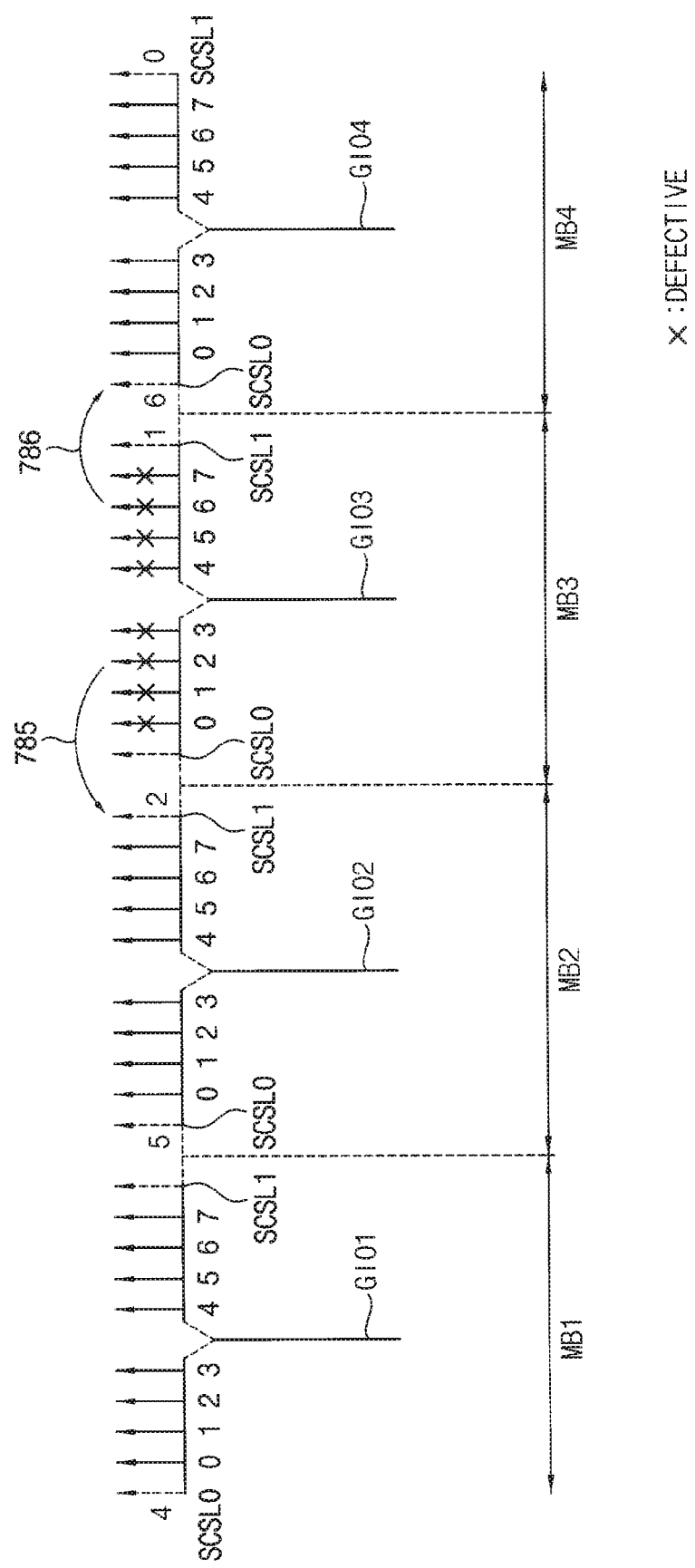

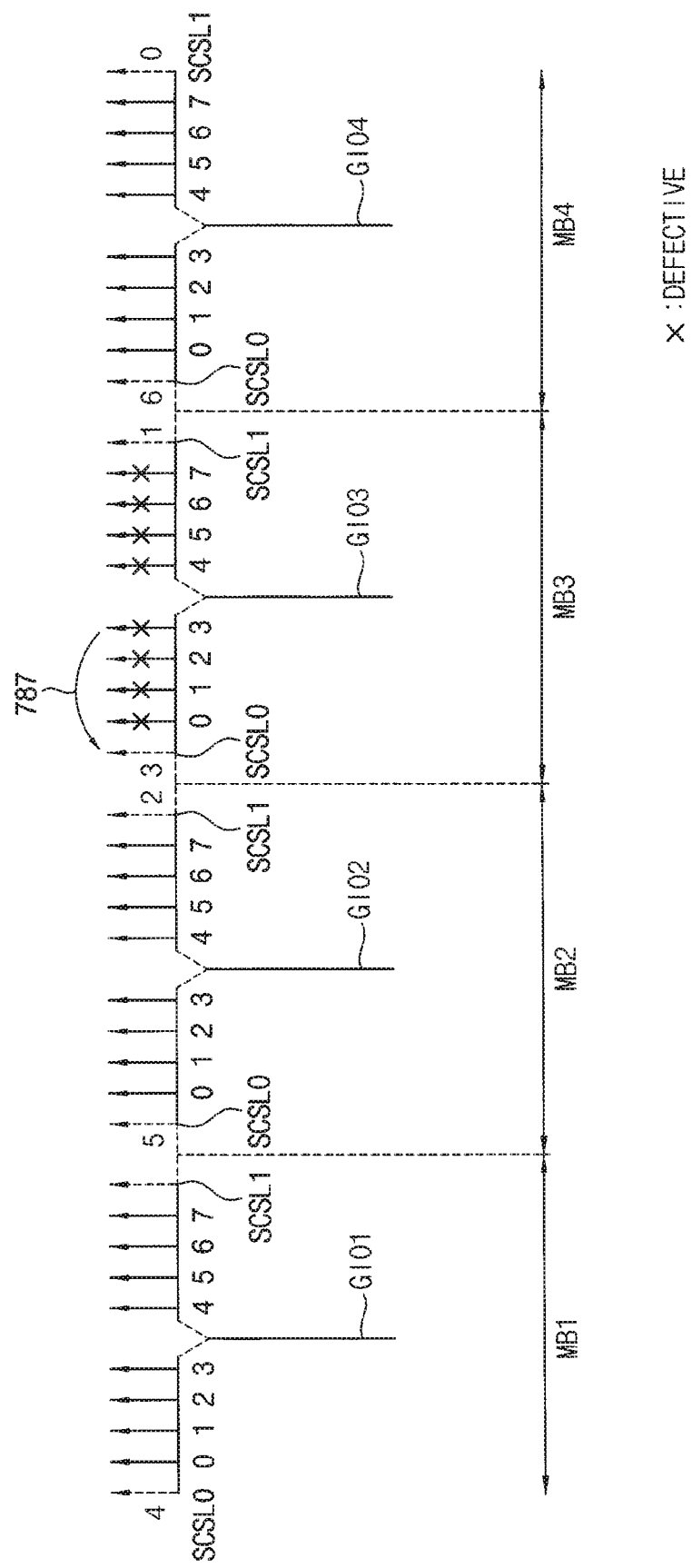

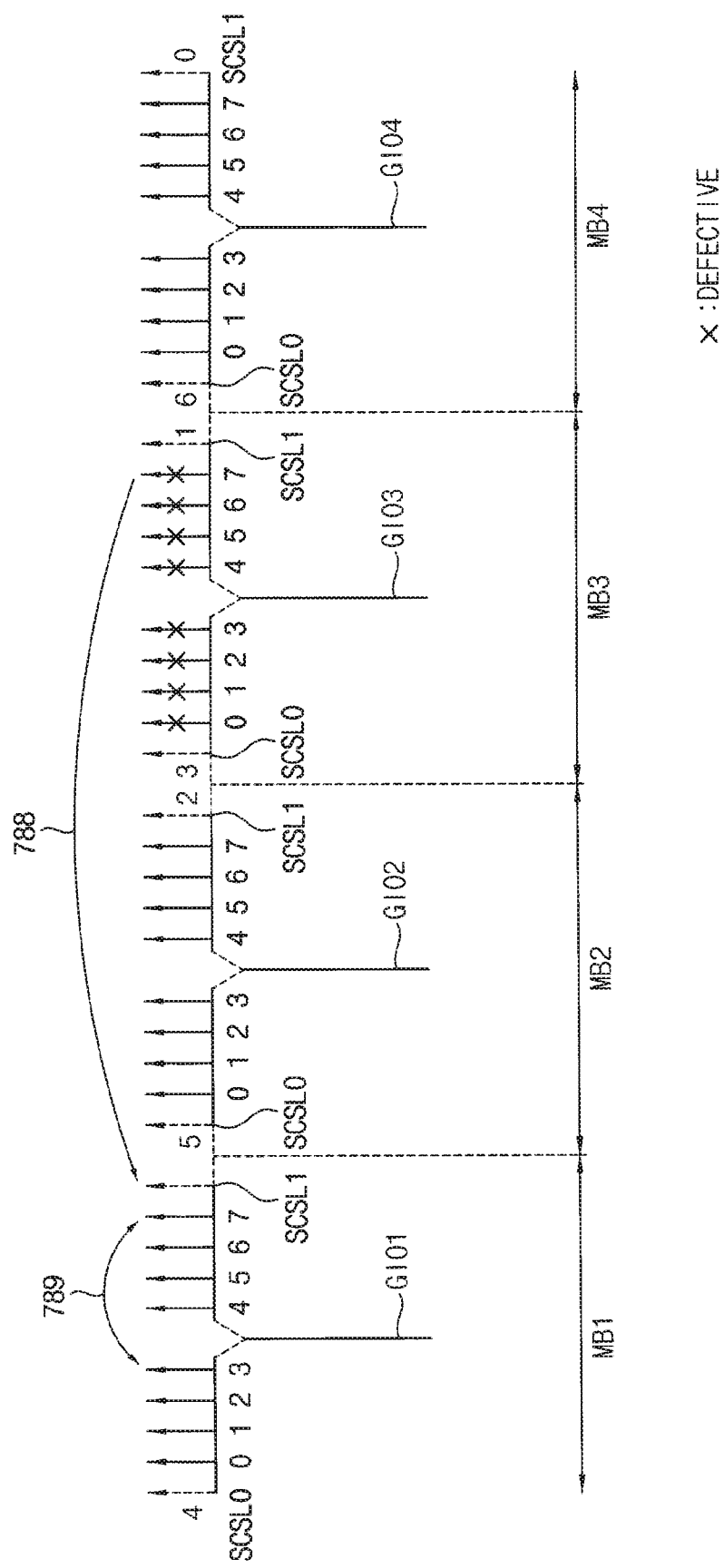

SEMICONDUCTOR MEMORY DEVICE CAPABLE OF INCREASING FLEXIBILITY OF A COLUMN REPAIR OPERATION

CROSS-REFERENCE TO RELATED APPLICATION

This U.S. application claims priority under 35 U.S.C. § 119 to Korean Patent Application No. 10-2019-0056832, filed on May 15, 2019 in the Korean Intellectual Property Office, the disclosure of which is incorporated by reference herein in its entirety.

TECHNICAL FIELD

Exemplary embodiments of the inventive concept relate to memory devices, and more particularly, to semiconductor memory devices and methods of operating semiconductor memory devices.

DISCUSSION OF RELATED ART

Semiconductor chips are manufactured through semiconductor manufacturing processes, and then tested by a test device in a wafer, a die, or a package state. Defective portions of defective chips are identified through testing, and if some memory cells are defective, repairs are performed to save semiconductor chips. Currently, semiconductor chips such as dynamic random access memories (DRAMs) continue to be reduced in size through fine processes, and accordingly, the possibility of errors occurring during the manufacturing process have been increased. In addition, if defects are not detected through initial test processes, errors may occur during chip operations.

SUMMARY

According to an exemplary embodiment of the inventive concept, a semiconductor memory device includes a memory cell array, at least one bit-line switch, at least one block switch, and a column decoder. The memory cell array includes a plurality of memory blocks coupled to at least one word-line, and each of the plurality of memory blocks includes a plurality of dynamic memory cells. The at least one bit-line switch is connected between a first half local input/output (I/O) line of a first memory block of the plurality of memory blocks and a second half local I/O line of the first memory block, where the first half local I/O line of the first memory block is connected to a first group of bit-lines of a plurality of bit-lines of the first memory block, and the second half local I/O line of the first memory block is connected to a second group of bit-lines of the plurality of bit-lines. The at least one block switch is connected between the second half local I/O line of the first memory block and a first half local I/O line of a second memory block among the plurality of memory blocks, and the first memory block and the second memory block are adjacent to each other. The column decoder includes a repair circuit, and the repair circuit controls a connection between the first half local I/O line of the first memory block and the second half local I/O line of the first memory block by applying a first switching control signal to the at least one bit-line switch, and controls a connection between the second half local I/O line of the first memory block and the first half local I/O line of the second memory block by applying a second switching control signal to the at least one block switch.

According to an exemplary embodiment of the inventive concept, a semiconductor memory device includes a memory cell array, at least one bit-line switch, at least one block switch, and a column decoder. The memory cell array includes a plurality of memory blocks coupled to at least one word-line, and each of the plurality of memory blocks includes a plurality of dynamic memory cells. The at least one bit-line switch is connected between a first half local input/output (I/O) line of a first memory block of the plurality of memory blocks and a second half local I/O line of the first memory block, where the first half local I/O line of the first memory block is connected to a first group of bit-lines of a plurality of bit-lines of the first memory block, and the second half local I/O line of the first memory block is connected to a second group of bit-lines of the plurality of bit-lines. The at least one block switch is connected between the second half local I/O line of the first memory block and a first half local I/O line of a second memory block among the plurality of memory blocks, and the first memory block and the second memory block are adjacent to each other. The column decoder repairs a first bit-line of the first memory block with at least one spare bit-line of the first memory block or with a spare bit-line of a memory block adjacent to the first memory block by controlling the at least one bit-line switch and the at least one block switch. The first bit-line is coupled to a defective cell of the plurality of dynamic memory cells.

According to an exemplary embodiment of the inventive concept, in a method of operating a semiconductor memory device, the semiconductor memory device includes a memory cell array including a plurality of memory blocks coupled to at least one word-line, each of the plurality of memory blocks including a plurality of dynamic memory cells, at least one bit-line switch coupled between a first half local input/output (I/O) line of a first memory block of the plurality of memory blocks and a second half local I/O line of the first memory block, and at least one block switch connected between the second half local I/O line of the first memory block and a first half local I/O line of a second memory block adjacent to the first memory block, the first half local I/O line of the first memory block is connected to a first group of bit-lines of a plurality of bit-lines of the first memory block, and the second half local I/O line of the first memory block is connected to a second group of bit-lines of the plurality of bit-lines. In the method, a first bit-line coupled to a defective cell of the first memory block is deactivated by a column decoder, in response to a column address, and the defective cell is repaired by the column decoder by controlling the at least one bit-line switch and the at least one block switch to activate a spare bit-line of the first memory block or a spare bit-line of the second memory block.

BRIEF DESCRIPTION OF THE DRAWINGS

The above and other features of the inventive concept will be better understood by describing in detail exemplary embodiments thereof with reference to the accompanying drawings.

FIGS. 2A through 2C illustrate a column repair performed in a semiconductor memory device according to exemplary embodiments of the inventive concept.

FIGS. 14A through 14E illustrate a semiconductor memory device performing a column repair, according to exemplary embodiments of the inventive concept.

FIG. 15 illustrates a semiconductor memory device performing a column repair according to an exemplary embodiment of the inventive concept.

FIGS. 17A through 17E illustrate a semiconductor memory device performing a column repair, according to an exemplary embodiment of the inventive concept.

DETAILED DESCRIPTION OF THE EMBODIMENTS

Figure 1:
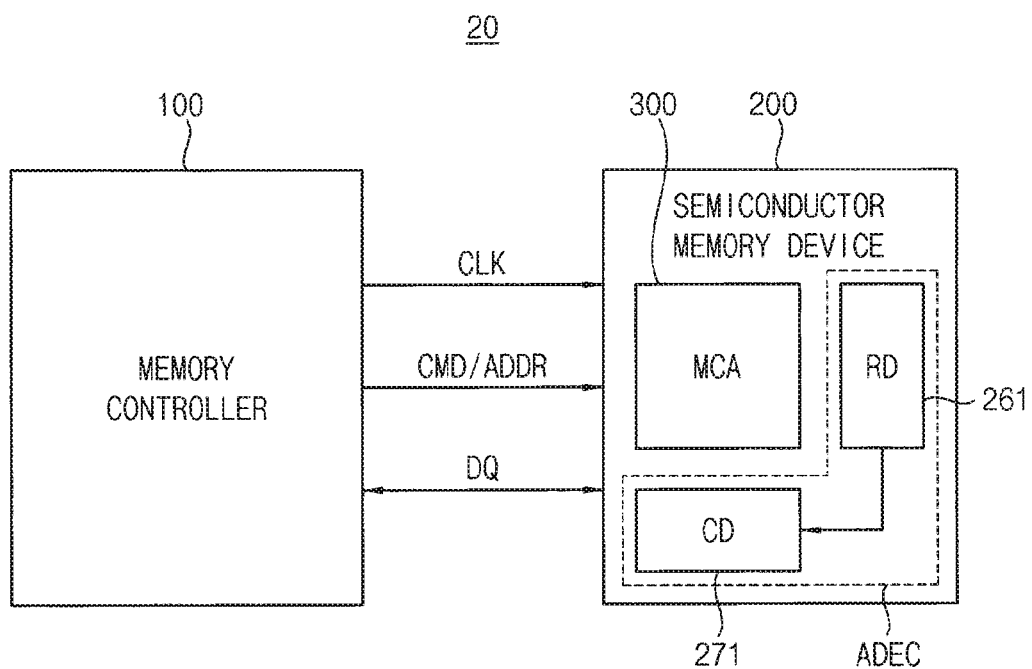
FIG. 1 is a block diagram illustrating a memory system according to an exemplary embodiment of the inventive concept.

Exemplary embodiments of the inventive concept provide a semiconductor memory device capable of increasing flexibility of a column repair operation.

Exemplary embodiments of the inventive concept also provide a method of operating a semiconductor memory device capable of increasing flexibility of a column repair operation.

Exemplary embodiments of the inventive concept will be described more fully hereinafter with reference to the accompanying drawings. Like reference numerals may refer to like elements throughout this application.

FIG. 1 is a block diagram illustrating a memory system according to an exemplary embodiment of the inventive concept.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to requests from the external host. In addition, the memory controller 100 may issue operation commands to the semiconductor memory device 200 for controlling the semiconductor memory device 200.

In exemplary embodiments of the inventive concept, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CLK, a command CMD, and an address (signal) ADDR to the semiconductor memory device 200, and exchanges data DQ with the semiconductor memory device 200.

The semiconductor memory device 200 includes a memory cell array (MCA) 300 that stores the data DQ received from the memory controller 100, and an address decoder ADEC. The address decoder ADEC may include a row decoder (RD) 261 and a column decoder (CD) 271.

The memory cell array 300 may include a plurality of memory blocks and each of the memory blocks may be divided into a plurality of row blocks by a row block identity bit corresponding to a portion of bits of a row address included in the address ADDR. The memory cell array 300 may include at least one bit-line switch and at least one block switch. The at least one bit-line switch may be connected between a first half local input/output (I/O) line and a second half local I/O line, the first half local I/O line may be connected to a first group of bit-lines of a plurality of bit-lines of each of the memory blocks, and the second half local I/O line may be connected to a second group of bit-lines of the plurality of bit-lines. The at least one block switch may be connected between a second half local I/O line of a first memory block among the memory blocks and a first half local I/O line of a second memory block among the memory blocks, and the first memory block and the second memory block may be adjacent to each other.

The row decoder 261 compares the row address and a defective row address of a defective cell, which is pre-stored, and output a row block match signal to the column decoder 271 if the row address matches the defective row address.

The column decoder 271 may repair a first bit-line coupled to the defective cell with at least one spare bit-line of the first memory block or a spare bit-line of the second memory block adjacent to the first memory block by controlling the at least one bit-line switch and the at least one block switch. In other words, the address decoder ADEC may change a physical column address of a memory cell that stores or outputs data based on the column address. Accordingly, the semiconductor memory device 200 may increase flexibility of a column repair operation.

Figure 2B:
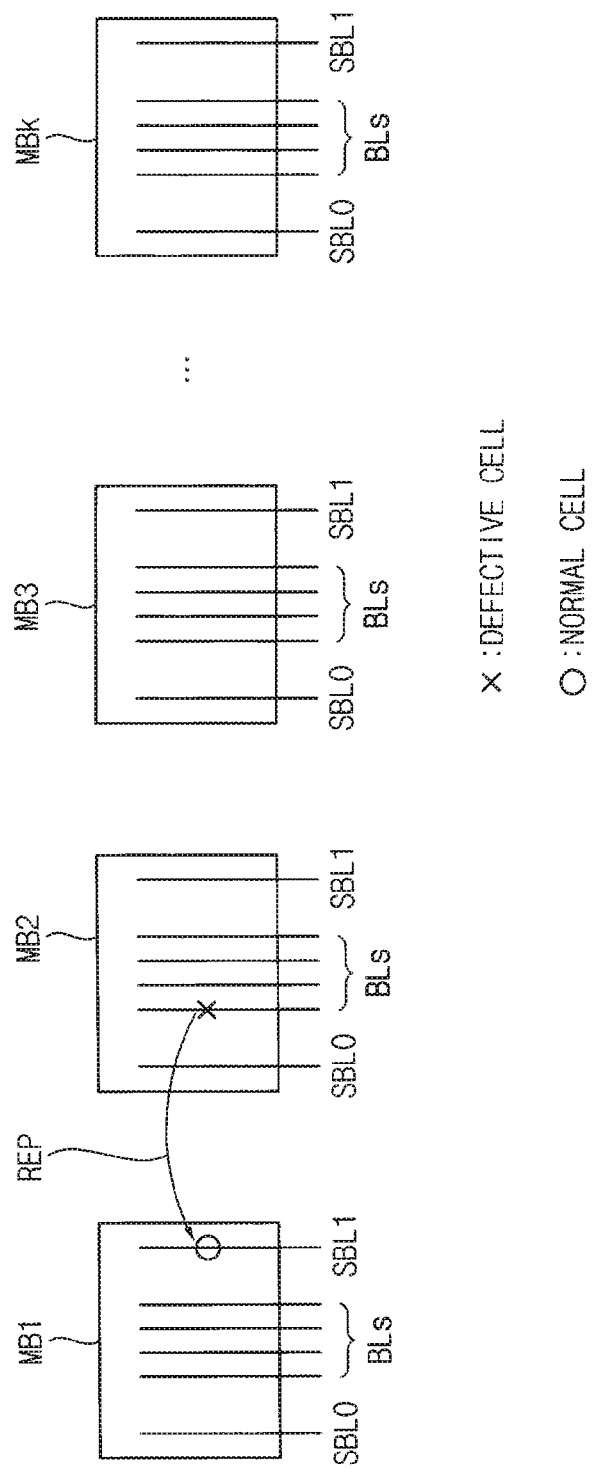

FIGS. 2A through 2C illustrate a column repair is performed in a semiconductor memory device according to exemplary embodiments of the inventive concept.

In FIGS. 2A through 2C, it is assumed that a row block of the memory cell array 300 in FIG. 1 includes memory blocks MB1~MBk, each of the memory blocks MB1~MBk includes bit-lines BLs, a first spare bit-line SBL0, and a second bit-line SBL1, and the memory block MB2 includes a defective cell. Here, k is a natural number greater than three. In addition, in FIGS. 2A through 2C, 'o' denotes a normal cell and 'x' denotes a defective cell.

Referring to FIG. 2A, it is noted that a bit-line coupled to the defective cell in the memory block MB2 is repaired with the first spare bit-line SBL0 in the memory block MB2 as indicated by a reference numeral REP.

Referring to FIG. 2B, it is noted that the bit-line coupled to the defective cell in the memory block MB2 is repaired with the second spare bit-line SBL1 in the memory block MB1 as indicated by the reference numeral REP.

Referring to FIG. 2C, it is noted that the bit-line coupled to the defective cell in the memory block MB2 is sequentially repaired with a bit-line in the memory block MB3 adjacent to the memory block MB2 and the second spare bit-line SBL1 in the memory block MB3 as indicated by reference numerals REP1 and REP2.

As is noted from FIGS. 2B and 2C, the semiconductor memory device 200 distributes repair resources in the memory blocks MB1~MBk equally and may use a spare bit-line in an adjacent memory block by controlling bit-line switches and block switches. Therefore, the semiconductor memory device 200 may increase flexibility of column repair and may increase yield.

Figure 3:
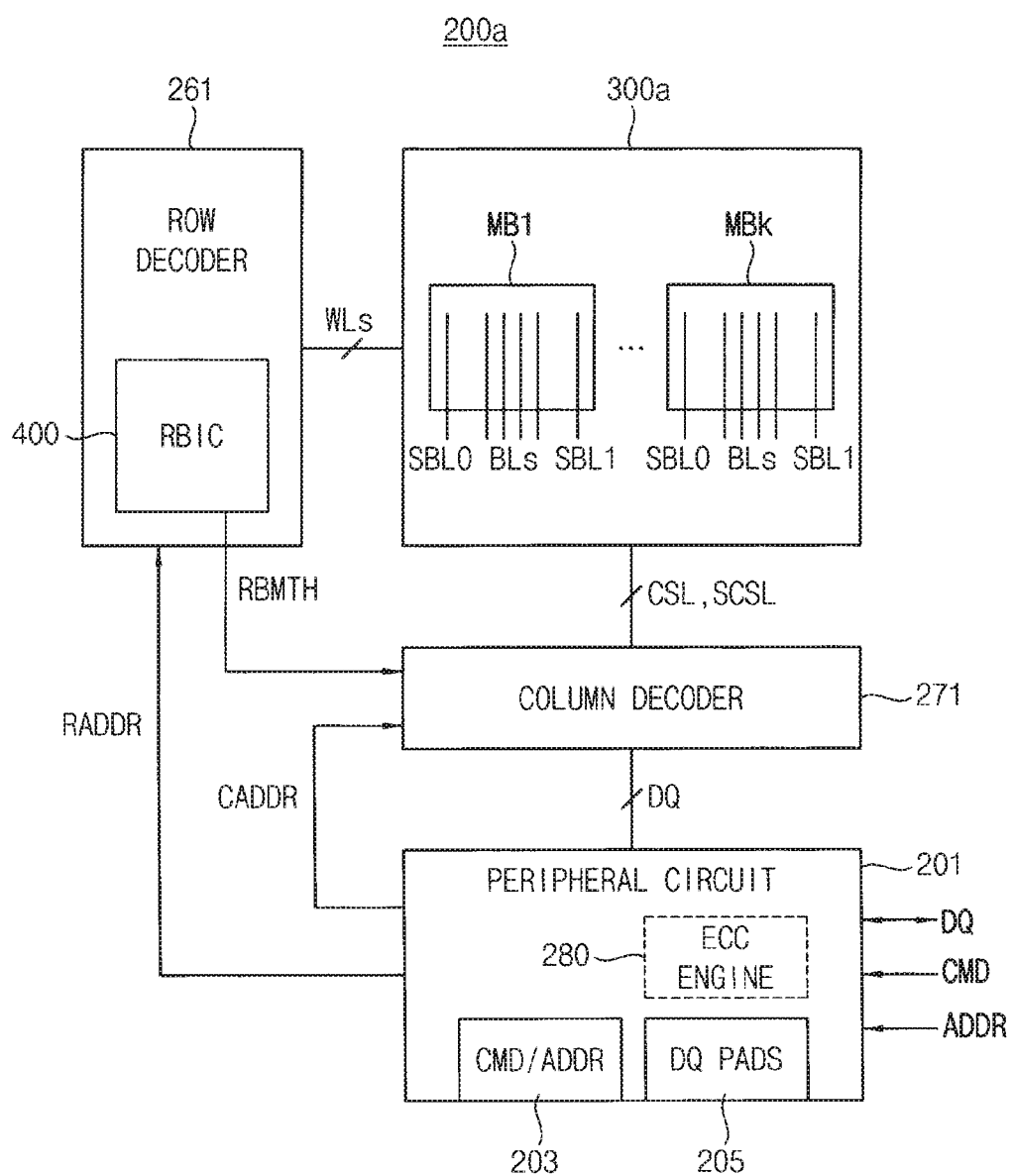
FIG. 3 is a block diagram illustrating a semiconductor memory device in FIG. 1 according to an exemplary embodiment of the inventive concept.

FIG. 3 is a block diagram illustrating a semiconductor memory device in FIG. 1 according to an exemplary embodiment of the inventive concept.

Referring to FIG. 3, a semiconductor memory device 200a includes a memory cell array 300a, the row decoder 261, the column decoder 271, and a peripheral circuit 201.

The memory cell array 300a may include a plurality of memory blocks MB1~MBk, and each of the memory blocks MB1~MBk includes memory cells coupled to word-lines WLs and bit-lines BLs, first spare cells coupled to the word-lines WLs and a first spare bit-line SBL0, and second spare cells coupled to the word-lines WLs and a second spare bit-line SBL1. The memory blocks MB1~MBk share the word-line WLs, and do not share the bit-lines BLs, the first spare bit-line SBL0, and the second spare bit-line SBL1. Data associated with each of the memory blocks MB1~MBk may be input/output through corresponding input/output pads of the memory cell array 300a.

The semiconductor memory device 200a may receive an active command before receiving a write command or a read command from an external device (e.g., a memory controller). All memory cells connected to the word-line WL of the semiconductor memory device 200a identified by the active command may be selected based on the active command. Next, if the semiconductor memory device 200a receives the write command or the read command, a plurality of bit-lines BLs may be selected. In an exemplary embodiment of the inventive concept, one or more of the bit-lines BLs illustrated in the memory blocks MB1~MBk may be selected by the write command or the read command. The data input/output may be performed on memory cells coupled to the selected bit-lines BLs.

Parity data for error correction of data stored in at least one of the memory blocks MB1~MBk may be stored in some of the memory blocks MB1~MBk.

The column decoder 271 may be connected to the memory cell array 300a through column selection lines CSL and spare column selection lines SCSL. The column decoder 271 may select the column selection lines CSL or the spare column selection lines SCSL based on the write command or the read command. If the column decoder 271 selects the column selection lines CSL, the corresponding bit-lines BLs are selected. When the column decoder 271 selects the spare column selection lines SCSL, the first spare bit-line SBL0 and the second spare bit-line SBL1 are selected.

The peripheral circuit 201 may include command/address pads (CMD/ADD) 203, input/output data (DQ) pads 205, and an error correction code (ECC) engine 280. In exemplary embodiments of the inventive concept, the ECC engine 280 may not be included in the peripheral circuit 201. The peripheral circuit 201 may receive the command CMD and the address ADDR from an external device (e.g., from memory controller 100) and may exchange the data DQ with the external device (e.g., with memory controller 100). The peripheral circuit 201 may provide a column address CADDR to the column decoder 271 and may provide a row address RADDR to the row decoder 261 according to the command CMD received from the external device (e.g., from memory controller 100). The peripheral circuit 201 may provide input data DQ to the column decoder 271 in response to the write command or may receive output data DQ from the column decoder 271 in response to the read command. The input data DQ may be input to the peripheral circuit 201 through the input/output data (DQ) pads 205. The output data DQ may be output to the memory controller 100 through the input/output data (DQ) pads 205.

The ECC engine 280 may perform an ECC encoding on the input data to generate parity data. The ECC engine 280 may store the input data DQ and the parity data in the memory blocks MB1~MBk. The ECC engine 280 may perform an ECC decoding on the output data DQ read from the memory blocks MB1~MBk to correct at least one error in the read data. The ECC engine 280 may transmit the corrected data to the memory controller 100 through the input/output data (DQ) pads 205.

The row decoder 261 may activate a first word-line WL in a first row block designated by the row address RADDR in response to the row address RADDR, and may output a row block match signal RBMTH to the column decoder 271 if the first row block includes at least one defective cell. The row decoder 261 may include a row block information circuit (RBIC) 400, and the row block information circuit 400 may store row block information of each row block of the memory blocks MB1~MBk and may output the row block match signal RBMTH.

Figure 4:
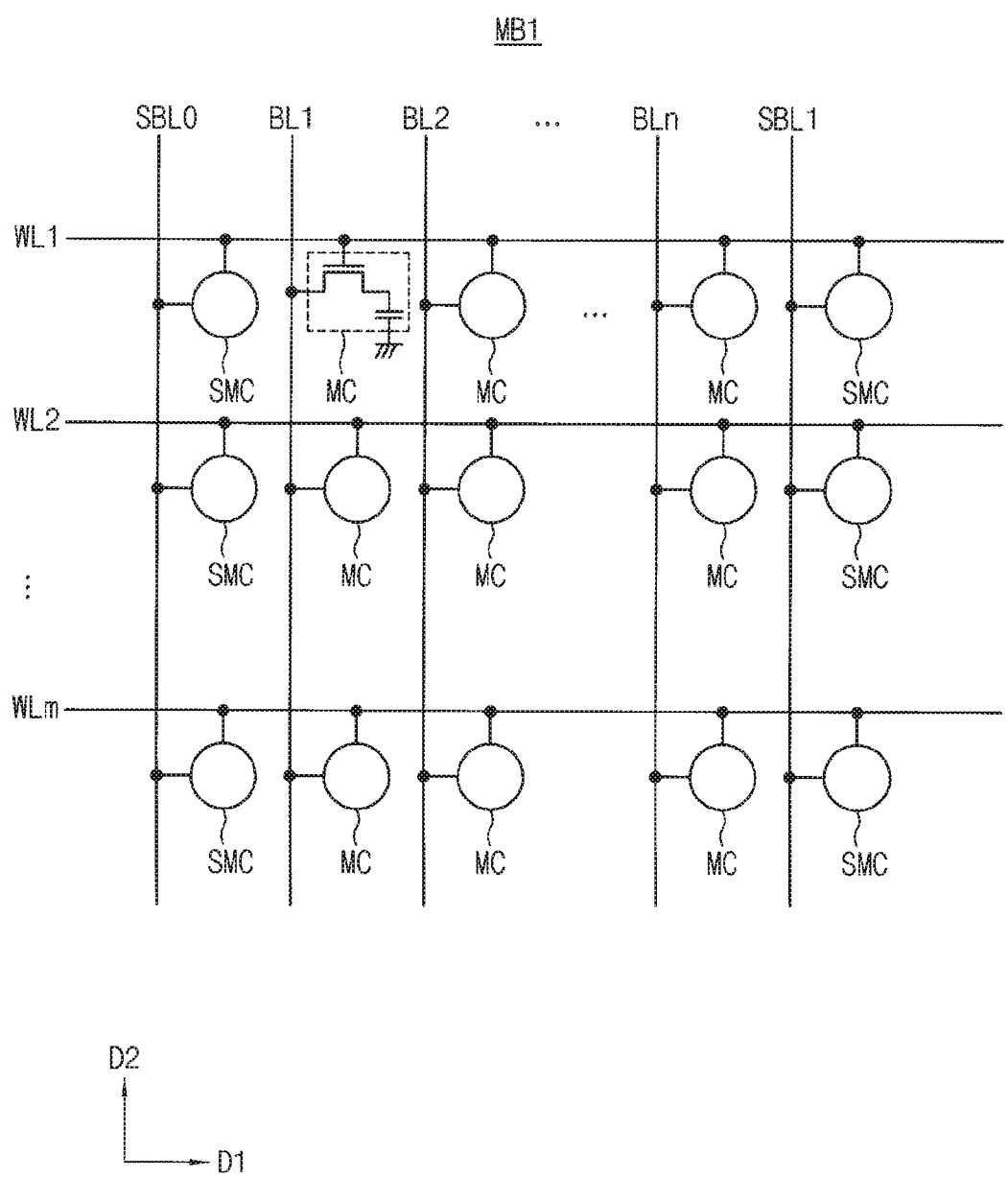
FIG. 4 illustrates a first memory block in the semiconductor memory device of FIG. 3 according to an exemplary embodiment of the inventive concept.

FIG. 4 illustrates a first memory block in the semiconductor memory device of FIG. 3 according to an exemplary embodiment of the inventive concept.

Referring to FIG. 4, a first memory block MB1 includes a plurality of memory cells MC coupled to a plurality of word-lines WL1~WLm (where m is a natural number greater than two) and a plurality of bit-lines BL1~BLn (where n is a natural number greater than two). The first memory block MB1 may further include a plurality of spare cells SMCs coupled to the word-lines WL1~WLm, the first spare bit-line SBL0, and the second spare bit-line SBL1. If at least one of the memory cells MCs has a defect, the defective memory cell may be repaired through the spare cells SMCs.

The word-lines WL1~WLm extend lengthwise in a first direction D1 and the bit-lines BL1~BLn and the first and second spare bit-lines SBL0 and SBL1 may extend lengthwise in a second direction D2 crossing the first direction D1. The first and second spare bit-lines SBL0 and SBL1 may be disposed in edge portions of the first memory block MB1. The edge portions are at edges of the first memory block MB1 with respect to the first direction D1.

Figure 5:
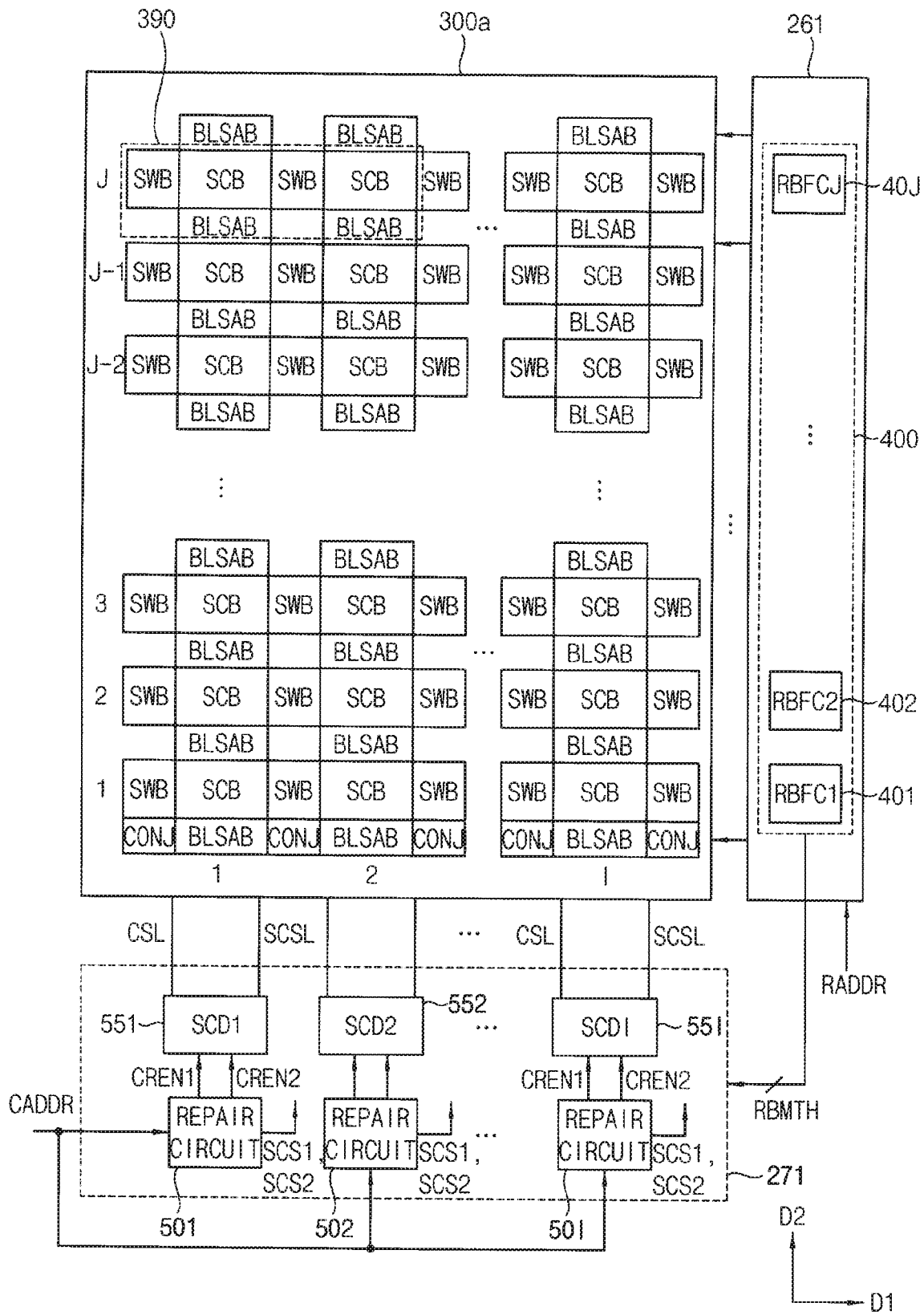
FIG. 5 illustrates a memory cell array, a row decoder, and a column decoder in the semiconductor memory device of FIG. 3 according to an exemplary embodiment of the inventive concept.

FIG. 5 illustrates a memory cell array, a row decoder, and a column decoder in the semiconductor memory device of FIG. 3 according to an exemplary embodiment of the inventive concept.

Referring to FIG. 5, in the memory cell array 300a, I sub-array blocks SCB may be disposed in columns 1 through I in the first direction D1, and J sub-array blocks SCB may be disposed in rows 1 through J in the second direction D2, the second direction being substantially perpendicular to the first direction D1. Sub-array blocks SCB disposed in the first direction D1 in any one row of rows 1 through J may be referred to as a row block. A plurality of bit-lines, a first spare bit-line, a second spare bit-line, a plurality of word-lines, a plurality of memory cells, and a plurality of spare cells may be disposed in each of the sub-array blocks SCB. Each of the sub-array blocks SCB may correspond to a memory block.

In FIG. 5, one sub-array block SCB in the second direction D2 may correspond to a memory segment and all the sub-array blocks SCB in the first direction D1 may correspond to a row block.

I+1 sub word-line driver regions SWB may be disposed between the sub-array blocks SCB in the first direction D1. Sub word-line drivers may be disposed in the sub word-line driver regions SWB. J+1 bit-line sense amplifier regions BLSAB may be disposed, for example, between the sub-array blocks SCB in the second direction D2. Bit-line sense amplifiers to sense data stored in the memory cells may be disposed in the bit-line sense amplifier regions BLSAB.

A plurality of conjunction regions CONJ may be disposed adjacent to the sub word-line driver regions SWB and the bit-line sense amplifier regions BLSAB. In exemplary embodiments of the inventive concept, the plurality of conjunction regions CONJ may be adjacent to the sub word-line driver regions SWB and to the bit-line sense amplifier regions BLSAB of the first row of the memory cell array 300a. A voltage generator is disposed in each of the conjunction regions CONJ.

The row decoder 261 includes the row block information circuit 400, and the row block information circuit 400 may include a plurality of row block fuse circuits (RBFCs) 401∞40J corresponding to the row blocks in the second direction D2. The row block fuse circuits (RBFCs) 401~40J may output the row block match signal RBMTH to the column decoder 271 in response to the row block identity bits of the row address RADDR.

The column decoder 271 may include a plurality of sub column decoders (SCD) 551~55I and a plurality of repair circuits 501~50I. Each of the sub column decoders 551~55I may be connected to a corresponding one of the memory sub-array blocks SCB, and each of the plurality of repair circuits 501~50I may correspond to one of the plurality of sub column decoders 551~55I. Each of the repair circuits 501~50I may selectively activate a first repair signal CREN1 and a second repair signal CREN2 in response to the column address CADDR and the row block match signal RBMTH to provide the first repair signal CREN1 and the second repair signal CREN2 to a corresponding one of the sub column decoders 551~55I. In addition, each of the repair circuits 501~50I may provide a first switching control signal SCS1 and a second switching control signal SCS2 to a corresponding one of the bit-line sense amplifier regions BLSAB and a corresponding one of the conjunction regions CONJ in response to the column address CADDR and the row block match signal RBMTH.

In response to the first repair signal CREN1 and the second repair signal CREN2, each of the sub column decoders 551~55I may select the column selection lines CSL or the spare column selection line SCSL. When the first repair signal CREN1 and the second repair signal CREN2 are deactivated by the repair circuits 501~50I, each of the sub column decoders 551~55I may select the column selection lines CSL.

When the first repair signal CREN1 is activated and the second repair signal CREN2 is deactivated, each of the sub column decoders 551~55I may select the spare column selection lines SCSL to activate the first spare bit-line SBL0. When the first repair signal CREN1 is deactivated and the second repair signal CREN2 is activated, each of the sub column decoders 551~55I may select the spare column selection lines SCSL to activate the second spare bit-line SBL1.

Figure 6A:
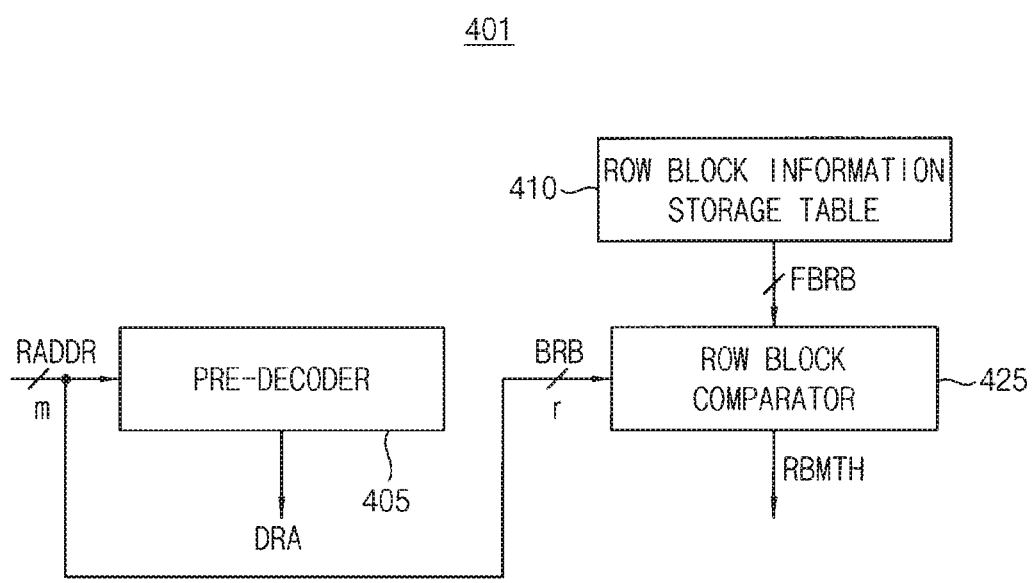
FIG. 6A is a block diagram illustrating a first row block fuse circuit of row block fuse circuits in FIG. 5 according to an exemplary embodiment of the inventive concept.

FIG. 6A is a block diagram illustrating a first row block fuse circuit of row block fuse circuits in FIG. 5 according to an exemplary embodiment of the inventive concept.

Each configuration of the row block fuse circuits 402~40J may be substantially the same as a configuration of a first row block fuse circuit 401.

Referring to FIG. 6A, the first row block fuse circuit 401 may include a pre-decoder 405, a row block information storage table 410, and a row block (address) comparator 425.

The pre-decoder 405 decodes the row address RADDR to provide a decoded row address DRA to a corresponding sub word-line driver disposed in a sub word-line driver region SWB. The corresponding sub word-line driver may activate a word-line corresponding to the decoded row address DRA, in response to the decoded row address DRA provided by the pre-decoder 405.

The row block information storage table 410 may store a defective row address FBRB associated with a defective row block including the at least one defective cell and a row block address information of a corresponding row block. The row block information storage table 410 may provide the defective row address FBRB to the row block comparator 425, and the row block comparator 425 may compare row block identity bits BRB received from the pre-decoder 405 with the defective row block address FBRB to provide the row block information storage table 410 with the row block match signal RBMTH indicating a result of the comparison of the row block identity bits BRB and with the defective row block address FBRB. The row block identity bits BRB may include some upper bits of the row address RADDR. For example, as will be discussed in connection with FIG. 7, when the row address RADDR includes m bits, the upper r bits of the row address RADDR may correspond to the row block identity bits BRB.

Figure 6B:
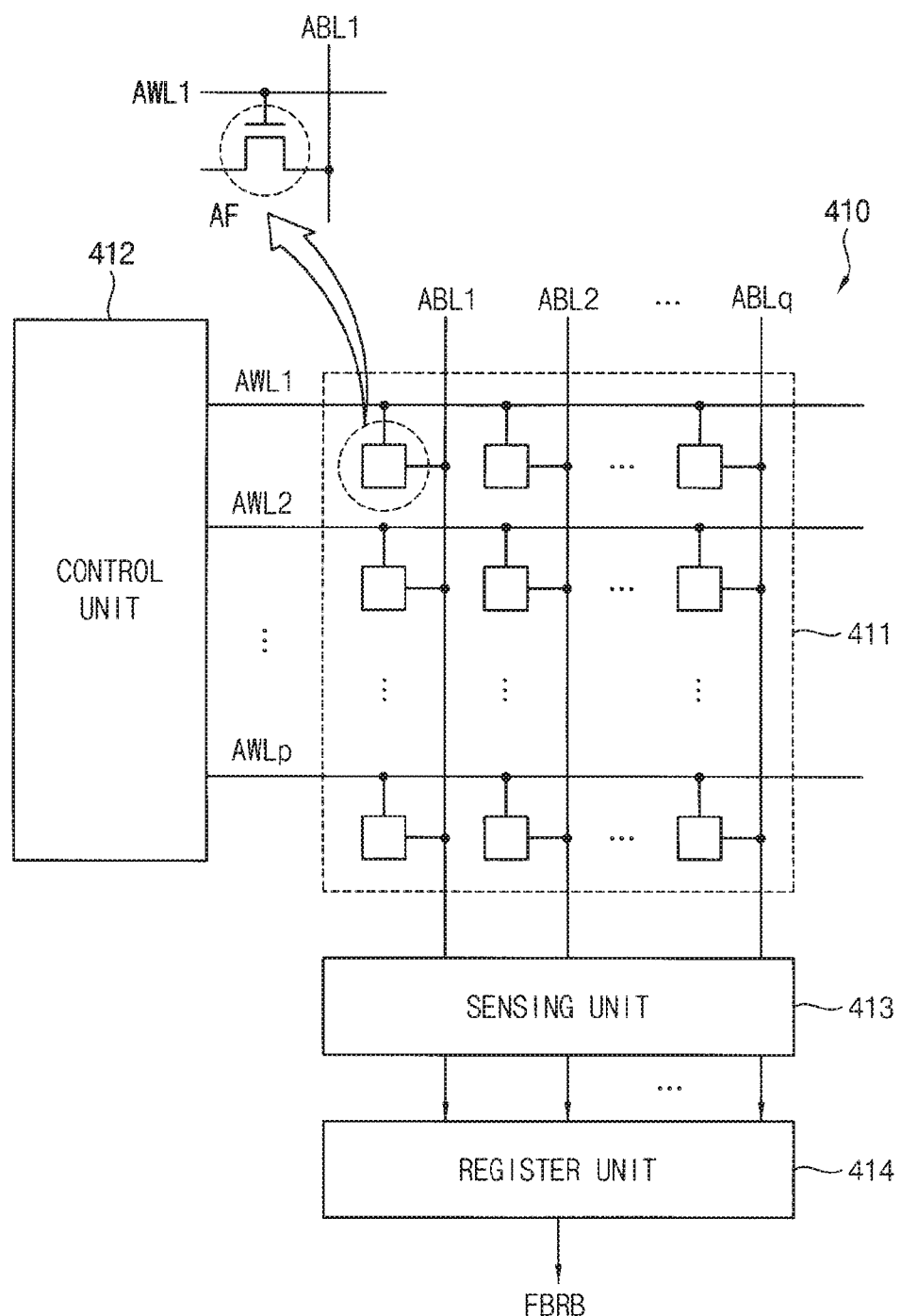
FIG. 6B illustrates a row block information storage table in the first row block fuse circuit of FIG. 6A according to an exemplary embodiment of the inventive concept.

FIG. 6B illustrates a row block information storage table in the first row block fuse circuit of FIG. 6A according to an exemplary embodiment of the inventive concept.

Referring to FIG. 6B, the row block information storage table 410 includes anti-fuse array 411, a control unit 412, a sensing unit 413, and a register unit 414.

The anti-fuse array 411 includes p*q anti-fuses (AFs) which are connected to intersections of p rows and q columns. The anti-fuse array 411 includes p word-lines AWL1 to AWLp for accessing anti-fuses (AFs) disposed at the p rows, and q bit-lines ABL1 to ABLq disposed to correspond to q columns so as to deliver information read from the anti-fuses (AFs).

The control unit 412 programs the defective row block address FBRB in the anti-fuse array 411, or the control unit 412 reads the defective row block address FBRB from the anti-fuse array 411. The sensing unit 413 may sense and amplify the defective row block address FBRB received from the anti-fuse array 411 and output a result of the amplifying. The register unit 414 may temporarily store the defective row block address FBRB received from the sensing unit 413. The register unit 414 outputs the defective row block address FBRB to the row block comparator 425 (e.g., of FIG. 6A).

Figure 7:
FIG. 7 illustrates a row address in FIG. 6A according to an exemplary embodiment of the inventive concept.

FIG. 7 illustrates a row address in FIG. 6A according to an exemplary embodiment of the inventive concept.

In FIG. 7, it is assumed that the row address RADDR includes 16-bits A0~A15.

Referring to FIG. 7, the upper 3-bits A15~A13 of the row address RADDR may be designated as the row block identity bits BRB. In this case, where the row block identity bits BRB includes 3 bits, the memory blocks MB1~MBk in FIG. 3 may be divided into eight row blocks disposed in the second direction D2.

Figure 8:
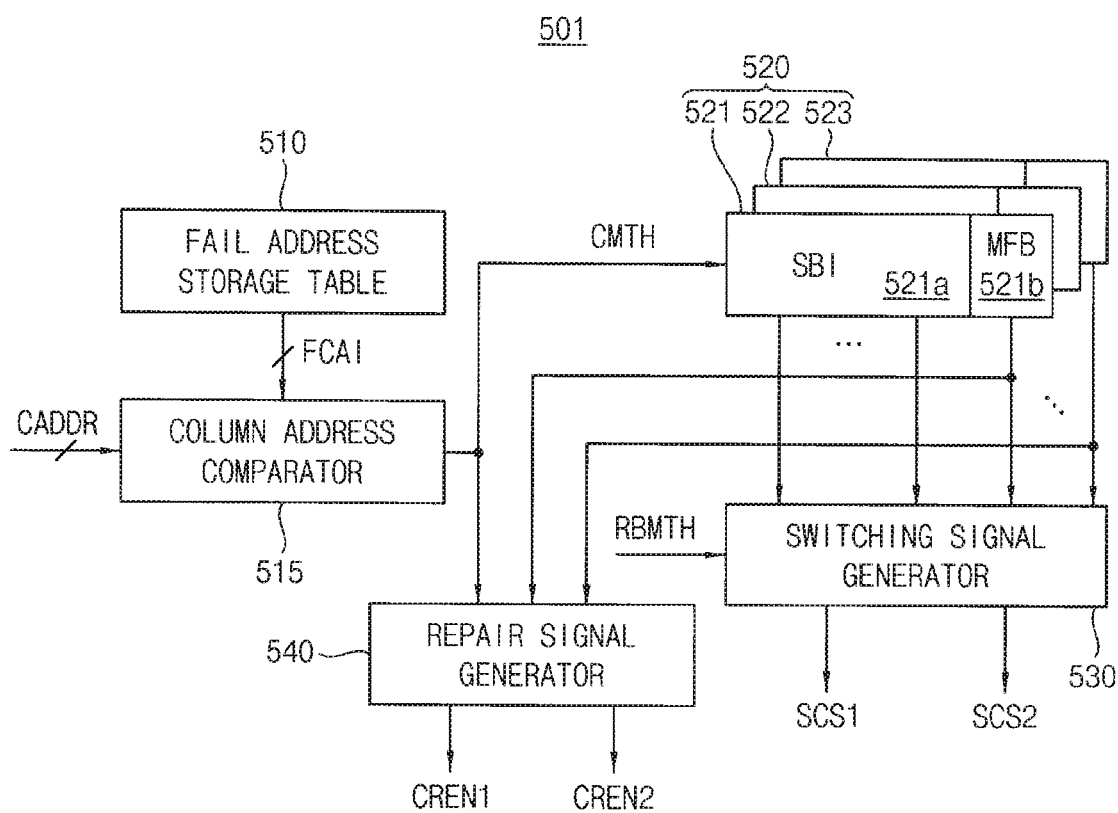
FIG. 8 is a block diagram illustrating a first repair circuit of repair circuits in FIG. 5 according to an exemplary embodiment of the inventive concept.

FIG. 8 is a block diagram illustrating a first repair circuit of repair circuits in FIG. 5 according to an exemplary embodiment of the inventive concept.

Each configuration of the repair circuits 502~50I may be substantially the same as a configuration of a first repair circuit 501.

Referring to FIG. 8 the first repair circuit 501 includes a defective address storage table 510, a column address comparator 515, a fuse circuit 520, a switching signal generator 530, and a repair signal generator 540.

The defective address storage table 510 may store defective column address information FCAI associated with column address information of defective cells of a corresponding memory block, and may send the defective column address information FCAI to the column address comparator 515. The column address comparator 515 may compare the column address CADDR with the defective column address information FCAI received from the defective address storage table 510 to output a column match signal CMTH to the fuse circuit 520 and the repair signal generator 540. The column match signal CMTH may indicate whether the column address CADDR matches the defective column address information FCAI. The defective address storage table 510 may have a similar configuration with the row block information storage table 410 of FIG. 6B.

The fuse circuit 520 includes a plurality of fuse sets 521, 522, and 523. The fuse sets 521, 522, and 523 may correspond to memory blocks constituting a row block. Each of the plurality of fuse sets 521, 522, and 523 may include a first region 521a and a second region 521b. The first region 521a may store a spare bit-line information SBI of a spare bit-line to repair a defective cell in each of the memory blocks and the second region 521b may store a master fuse bit MFB associated with a usability of a spare bit-line of the corresponding memory block (e.g., usability of a spare bit-line in a different memory block). In response to the column match signal CMTH, the fuse circuit 520 may provide the spare bit-line information SBI and the master fuse bit MFB to the switching signal generator 530, and may provide the master fuse bit MFB to the repair signal generator 540.

The switching signal generator 530 may generate the first switching control signal SCS1 and the second switching control signal SCS2 based on the row block match signal RBMTH, the spare bit-line information SBI, and the master fuse bit MFB. The first switching control signal SCS1 may control turning-on/turning off of a bit-line switch connected between a first half local I/O line and a second half local I/O line in a memory block. The second switching control signal SCS1 may control turning-on/turning off of a block switch connected between a second half local I/O line and a first half local I/O line in two adjacent memory blocks.

The repair signal generator 540 may selectively activate each of the first repair signal CREN1 and the second repair signal CREN2 based on the column match signal CMTH and the master fuse bit MFB. For example, when the column match signal CMTH indicates that the column address CADDR does not match the defective column address information FCAI, the repair signal generator 540 deactivates both the first repair signal CREN1 and the second repair signal CREN2 by application of a low level voltage signal. When the first repair signal CREN1 and the second repair signal CREN2 are both deactivated, the first sub column decoder 551 in FIG. 5 may activate the column selection line CSL.

For example, when the column match signal CMTH indicates the column address CADDR matches the defective column address information FCAI, and the master fuse bit MFB indicates that a first spare bit-line in a corresponding memory block is to be used, the repair signal generator 540 activates the first repair signal CREN1 by application of a high level voltage signal and deactivates the second repair signal CREN2 by application of a low level voltage signal. In this case, the first sub column decoder 551 in FIG. 5 selects the spare column selection line SCSL, and the selected spare column selection line SCSL, in turn, selects the first spare bit-line SBL0.

For example, when the column match signal CMTH indicates the column address CADDR matches the defective column address information FCAI, and the master fuse bit MFB indicates that a second spare bit-line in a corresponding segment is to be used, the repair signal generator 540 deactivates the first repair signal CREN1 by application of a low level voltage signal, and activates the second repair signal CREN2 by application of a high level voltage signal. In this case, the first sub column decoder 551 in FIG. 5 selects the spare column selection line SCSL, and the selected spare column selection line SCSL, in turn, selects the second spare bit-line SBL1.

For example, when the column match signal CMTH indicates the column address CADDR matches the defective column address information FCAI, and the master fuse bit MFB indicates that spare bit-lines in a corresponding segment is not usable, the repair signal generator 540 deactivates the first repair signal CREN1 by application of a low level voltage signal, and deactivates the second repair signal CREN2 by application of a low level voltage signal. In this case, the first sub column decoder 551 in FIG. 5 selects the spare column selection line SCSL, the block switch is connected, and the first spare bit-line SBL0 in a memory block adjacent to the corresponding memory block is selected.

Figure 9:
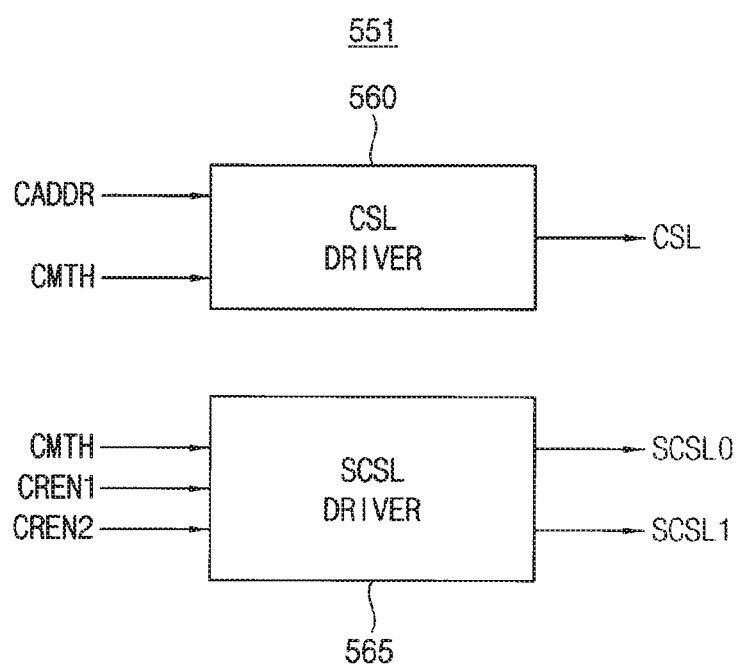
FIG. 9 is a block diagram illustrating a first sub column decoder of sub column decoders in FIG. 5 according to an exemplary embodiment of the inventive concept.

FIG. 9 is a block diagram illustrating a first sub column decoder of sub column decoders in FIG. 5 according to an exemplary embodiment of the inventive concept.

Each configuration of the sub column decoders 551~55J may be substantially the same as a configuration of a first sub column decoder 551.

Referring to FIG. 9, the first sub column decoder 551 may include a column selection line (CSL) driver 560 and a spare column selection line (SCSL) driver 565.

The column selection line driver 560 may select one of the column selection lines CSL in response to the column address CADDR and the column match signal CMTH. When the column match signal CMTH is a high level CMTH, the column selection line driver 560 does not select the column selection lines CSL. To this end, the column selection line driver 560 may first receive the column match signal CMTH before selecting any one of the column selection lines CSL. The spare column selection line driver 565 may select one of a first spare column selection line SCSL0 and a second spare column selection line SCSL1 in response to the column match signal CMTH, the first repair signal CREN1, and the second repair signal CREN2.

Figure 10:
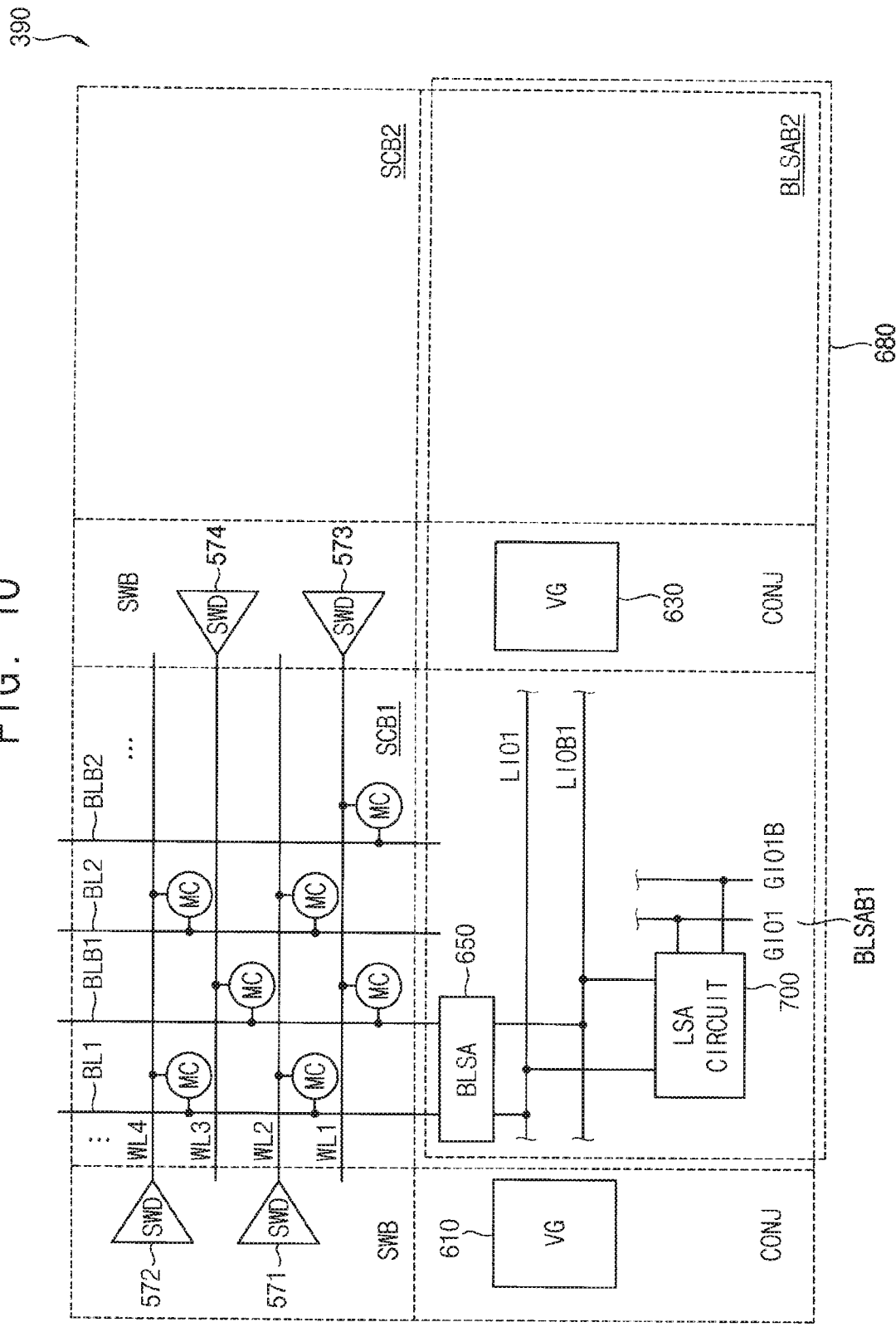
FIG. 10 illustrates a portion of the memory cell array in FIG. 5 according to an exemplary embodiment of the inventive concept.

FIG. 10 illustrates a portion of the memory cell array in FIG. 5 according to an exemplary embodiment of the inventive concept.

Referring to FIGS. 5 and 10, in a portion 390 (FIG. 5) of the memory cell array 300a, the sub-array blocks SCB1 and SCB2, the bit-line sense amplifier regions BLSAB1 and BLSAB2, the sub word-line driver regions SWB, and the conjunction regions CONJ may be disposed.

The sub-array block SCB1 includes a plurality of word-lines WL1~WL4 extending in a row direction (the first direction D1) and a plurality of bit-line pairs BL1~BL2 and BLB1~BLB2 extending in a column direction (the second direction D2). The sub-array block SCB1 includes a plurality of memory cells MCs disposed at intersections between the word-lines WL1~WL4 and the bit-line pairs BL1~BL2 and BLB1~BLB2.

The sub word-line driver regions SWB include a plurality of sub word-line drivers (SWD) 571, 572, 573, and 574 that respectively drive the word-lines WL1~WL4. The sub word-line drivers (SWD) 571, 572, 573, and 574 may be disposed in different regions relative to the sub-array block SCB. For example, the sub word-line drivers 571 and 572 may be disposed in the sub word-line driver region SWB, which is leftward (in this example) with respect to the sub-array block SCB. In addition, the sub word-line drivers 573 and 574 may be disposed in the sub word-line driver region SWB, which is rightward (in this example) with respect to the sub-array block SCB.

The bit-line sense amplifier region BLSAB1 include a bit-line sense amplifier BLSA 650 coupled to the bit-line pairs BL1~BL2 and BLB1~BLB2 and a local sense amplifier circuit 700. For example, the bit-line sense amplifier BLSA 650 is coupled to bit-lines BL1 and BLB1, and may sense and amplify a voltage difference between the corresponding bit-line pairs BL1 and BLB1 to provide the amplified voltage difference to a corresponding local I/O line pair LIO1 and LIOB1. For example, in the case of bit-lines BL1 and BLB1, the amplified voltage difference may be provided to the local I/O line pair LIO1 and LIOB1, and in the case of bit-lines BL2 and BLB2, the amplified voltage difference may be provided to a local I/O line pair LI02 and LIOB2. The local sense amplifier circuit 700 controls a connection between the local I/O line pair LIO1 and LIOB1 and a global I/O line pair GIO1 and GIOB1.

As illustrated in FIG. 10, the bit-line sense amplifiers (such as the bit-line sense amplifier 650) may be alternately disposed at upper portion and a lower portion of the bit-line sense amplifier region BLSAB1. The conjunction regions CONJ are disposed adjacent to the bit-line sense amplifier regions BLSAB1 and BLSAB2, the sub word-line driver regions SWB, and the sub-array blocks SCB1 and SCB2. A plurality of voltage generators 610 and 630 may be disposed in the conjunction regions CONJ. In FIG. 10, the memory cells MC coupled to the word-lines WL1~WL4 and the bit-line pairs BL1~BL2 and BLB1~BLB2 are illustrated. The sub-array block SCB1 may include spare cells coupled to the word-lines WL1~WL4, a first spare bit-line, and a second spare bit-line.

Figure 11:
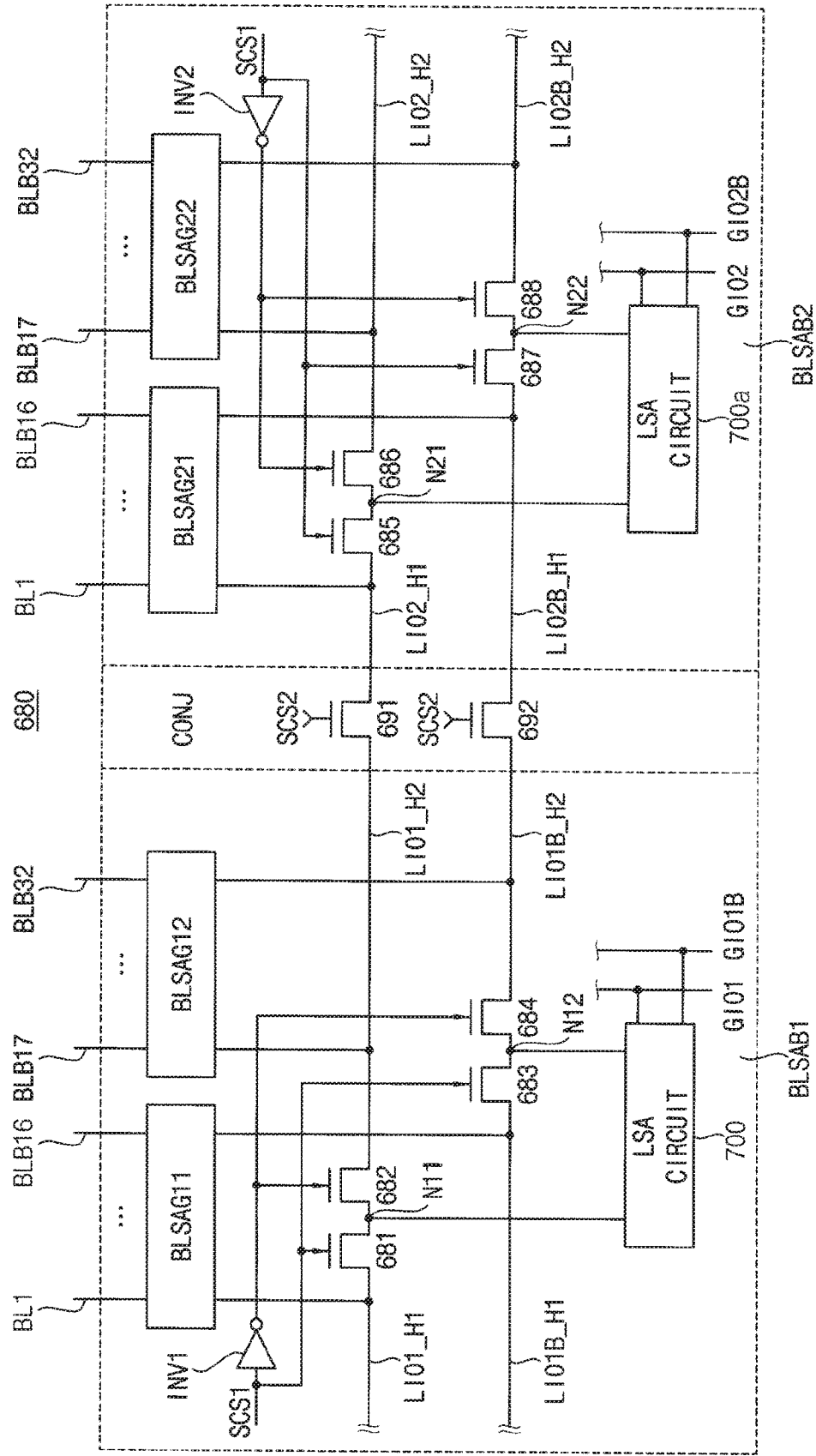
FIG. 11 illustrates a portion in FIG. 10 according to an exemplary embodiment of the inventive concept.

FIG. 11 illustrates a portion in FIG. 10 according to an exemplary embodiment of the inventive concept.

Referring to FIG. 11, a portion 680 of the portion 390 includes the bit-line sense amplifier regions BLSAB1 and BLSAB2 and the conjunction region CONJ which is disposed adjacent to the bit-line sense amplifier regions BLSAB1 and BLSAB2.

The bit-line sense amplifier region BLSAB1 may include a first group of bit-line sense amplifiers BLSAG11 connected to a first group of bit-lines (bit-line pairs) BL1~BLB16 of a corresponding memory block, a second group of bit-line sense amplifiers BLSAG12 connected to a second group of bit-lines (bit-line pairs) BL17~BLB32 of the corresponding memory block, and a local sense amplifier circuit 700. The bit-line sense amplifier region BLSAB1 may further include first half local I/O lines (line pair) LIO1_H1 and LIO1B_H1 connected to the first group of bit-lines BL1~BLB16 through the first group of bit-line sense amplifiers BLSAG11, second half local I/O lines (line pair) LIO1_H2 and LIO1B_H2 connected to the second group of bit-lines BL17~BLB32 through the second group of bit-line sense amplifiers BLSAG12, bit-line switches 681, 682, 683, and 684, and an inverter INV1.

The bit-line switches 681 and 682 are connected between the first half local I/O line LIO1_H1 and the second half local I/O line LIO1_H2 and control connection of the first half local I/O line LIO1_H1 and the second half local I/O line LIO1_H2 in response to the first switching control signal SCS1 and an inverted version of the first switching control signal SCS1, respectively. The local sense amplifier circuit 700 is connected to a first node N11 between the bit-line switches 681 and 682, a second node N12 between the bit-line switches 683 and 684, and the global I/O lines GIO1 and GIO1B.

A configuration of the bit-line switches 683 and 684, the first half local I/O line LIO1B_H1, and the second half I/O line LIO1B_H2 may be substantially the same as that of the bit-line switches 681 and 682, the first half local I/O line LIO1_H1, and the second half I/O line LIO1_H2.

The bit-line sense amplifier region BLSAB2 may include a first group of bit-line sense amplifiers BLSAG21 connected to a first group of bit-lines (bit-line pairs) BL1~BLB16 of a corresponding memory block, a second group of bit-line sense amplifiers BLSAG22 connected to a second group of bit-lines (bit-line pairs) BL17~BLB32 of the corresponding memory block, and a local sense amplifier circuit 700a. The bit-line sense amplifier region BLSAB2 may further include first half local I/O lines (line pair) LIO2_H1 and LIO2B_H1 connected to the first group of bit-lines BL1~BLB16 through the first group of bit-line sense amplifiers BLSAG21, second half local I/O lines (line pair) LIO2_H2 and LIO2B_H2 connected to the second group of bit-lines BL17~BLB32 through the second group of bit-line sense amplifiers BLSAG22, bit-line switches 685, 686, 687, and 688, and an inverter INV2.

The bit-line switches 685 and 686 are connected between the first half local I/O line LIO2_H1 and the second half local I/O line LIO2_H2 and control connection of the first half local I/O line LIO2_H1 and the second half local I/O line LIO2_H2 in response to the first switching control signal SCS1 and an inverted version of the first switching control signal SCS1, respectively. The local sense amplifier circuit 700a is connected to a first node N21 between the bit-line switches 685 and 686, a second node N22 between the bit-line switches 687 and 688, and global I/O lines GIO2 and GIO2B.

A configuration of the bit-line switches 687 and 688, the first half local I/O line LIO2B_H1, and the second half I/O line LIO2B_H2 may be substantially the same as that of the bit-line switches 685 and 686, the first half local I/O line LIO2_H1, and the second half I/O line LIO2_H2.

The conjunction region CONJ may include block switches 691 and 692. The block switch 692 is connected between the second half local I/O line LIO1_H2 and the first half local I/O line LIO2_H1 in two adjacent memory blocks, and controls connection of the second half local I/O line LIO1_H2 and the first half local I/O line LIO2_H1 in response to the second switching control signal SCS2. The block switch 692 is connected between the second half local I/O line LIO1B_H2 and the first half local I/O line LIO2B_H1 in two adjacent memory blocks, and controls connection of the second half local I/O line LIO1B_H2 and the first half local I/O line LIO2B_H1 in response to the second switching control signal SCS2.

Figure 12:
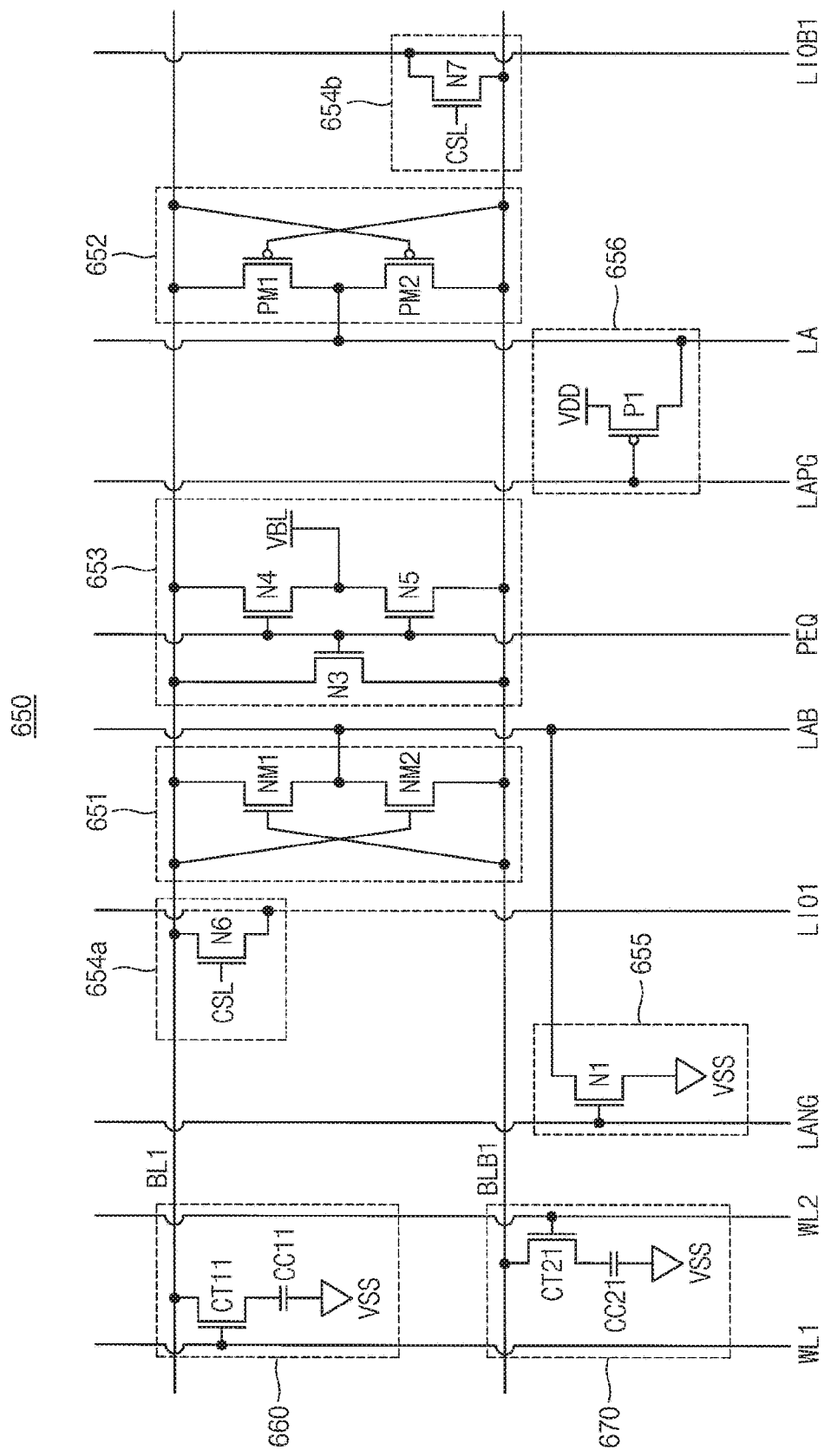
FIG. 12 is a circuit diagram illustrating a bit-line sense amplifier in FIG. 10, according to an exemplary embodiment of the inventive concept.

FIG. 12 is a circuit diagram illustrating a bit-line sense amplifier in FIG. 10, according to an exemplary embodiment of the inventive concept.

Referring to FIG. 12, the bit-line sense amplifier (BLSA) 650 is coupled to bit-lines BL1 and BLB1 of each of memory cells 660 and 670 in the memory cell array 300. The bit-line sense amplifier 650 includes an N-type sense amplifier 651, a P-type sense amplifier 652, a pre-charge circuit 653, column select switches 654a and 654b, an N-type sense amplifier (NSA) driver 655, and a P-type sense amplifier (PSA) driver 656.

The N-type sense amplifier 651 discharges a low-level bit-line of the bit-lines (or, bit-line pair) BL1 and BLB1 to a low level during a sensing operation. The N-type sense amplifier 651 includes two n-channel metal oxide semiconductor (NMOS) transistors NM1 and NM2. A gate of the NMOS transistor NM1 is connected to the bit-line (second bit-line) BLB1, and a drain of the NMOS transistor NM1 is connected to the bit-line (first bit-line) BL1, and a source of the NMOS transistor NM1 is connected to a sense enable line LAB. The NMOS transistor NM2 has a gate connected to the bit-line BL1, a drain connected to the sense enable line LAB, and a source connected to the bit-line BLB1.

The N-type sense amplifier 651 connects the low-level bit-line to the sense enable line LAB.

The P-type sense amplifier 652 charges a high-voltage bit-line of the bit-lines BL1 and BLB1 with a power supply voltage VDD during a sensing operation. The P-type sense amplifier 652 includes two p-channel metal oxide semiconductor (PMOS) transistors PM1 and PM2. The PMOS transistor PM1 has a gate connected to the bit-line BLB1, a source connected to the bit-line BL1, and a drain connected to a sense enable line LA. The PMOS transistor PM2 has a gate connected to the bit-line BL1, a source connected to the sense enable line LA, and a drain connected to the bit-line BLB1.

The P-type sense amplifier 652 charges the high-voltage bit-line of the bit-lines BL1 and BLB1 with the power supply voltage VDD provided to the sense enable line LA.

The PSA driver 656 provides a charging voltage (e.g., the power supply voltage VDD) to the sense enable line LA. Therefore, the transistor PM2 is turned off because the gate of the transistor PM2 is coupled to the bit-line BL1 with a voltage increased by the charge sharing. The PSA driver 656 includes a PMOS transistor P1.

The pre-charge circuit 653 pre-charges the bit-lines BL1 and BLB1 with a half voltage VDD/2 in response to a control signal PEQ in the sensing operation. When the control signal PEQ is activated, the pre-charge circuit 653 supplies a bit-line pre-charge voltage VBL to the bit-lines BL1 and BLB1. The bit-line pre-charge voltage VBL may be the half voltage VDD/2. The bit-lines BL1 and BLB1 are connected such that their voltages are equalized. If the bit-lines BL1 and BLB1 are charged by the bit-line pre-charge voltage VBL, the control signal PEQ is inactivated. The pre-charge circuit 653 includes NMOS transistors N3, N4, and N5.

The column select switches 654a and 654b provide data sensed by the N-type and P-type sense amplifiers 651 and 652 to input/output lines LIO1 and LIOB1 in response to a column selection signal CSL. The column select switches 654a and 654b are turned on such that the sensed data is transferred to the input/output lines LIO1 and LIOB1. For example, in a read operation when sensing levels of the N-type and P-type sense amplifiers 651 and 652 are stabilized, the column selection signal CSL is activated. Then, the column select switches 654a and 654b are turned on such that the sensed data is transferred to the local I/O line pair LIO1 and LIOB1. Voltages of the bit-lines BL1 and BLB1 are varied when charges of the bit-lines BL1 and BLB1 are shared with the input/output lines LIO1 and LIOB1. The column select switches 654a and 654b includes NMOS transistors N6 and N7, respectively.

The NSA driver 655 provides a driving signal to the sense enable line LAB of the N-type sense amplifier 651. The NSA driver 655 receives a control signal LANG. Based on the control signal LANG, the NSA driver 655 grounds the sense enable line LAB. The NSA driver 655 includes a ground transistor N1 connected to a ground voltage VSS to control a voltage of the sense enable line LAB. The PSA driver 656 provides the power supply voltage VDD to the sense enable line LA of the P-type sense amplifier 652. The PSA driver 656 is controlled by a control signal LAPG. The control signals LAPG and LANG are complementary to each other.

Figure 13:
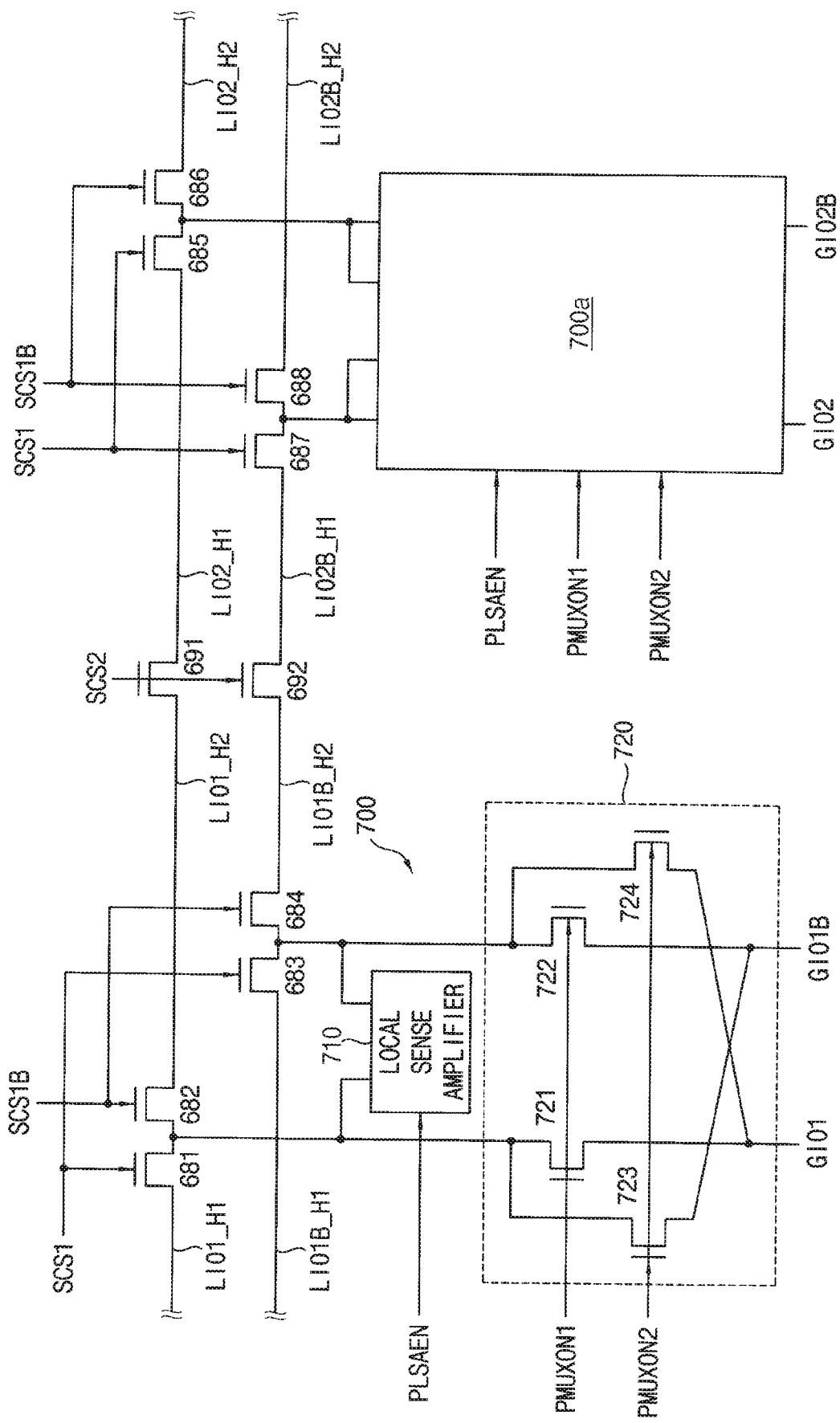
FIG. 13 illustrates local sense amplifier circuits in FIG. 11 according to an exemplary embodiment of the inventive concept.

FIG. 13 illustrates local sense amplifier circuits in FIG. 11 according to an exemplary embodiment of the inventive concept.

Referring to FIG. 13, the local sense amplifier circuit 700 includes a local sense amplifier 710 and a local I/O line controller 720.

The local sense amplifier 710 amplifies a voltage difference between the first half local I/O line pair LIO1_H1 and LIO1B_H1 or between the second half local I/O line pair LIO1_H2 and LIO1B_H2 in response to a local sense enable signal PLSAEN to provide the amplified voltage difference to the global I/O line pair GIO1 and GIOB1. The local I/O line controller 720 includes first through fourth NMOS transistors 721, 722, 723, and 724, and controls connection between the global I/O line pair GIO1 and GIO1B and one of the first half local I/O line pair LIO1_H1 and LIO1B_H1 and the second half local I/O line pair LIO1_H21 and LIO1B_H2, in response to a first connection control signal PMUXON1 and a second connection control signal PMUXON2.

Configuration of the local sense amplifier circuit 700a is substantially the same as a configuration of the local sense amplifier circuit 700. The local sense amplifier circuit 700*a* amplifies a voltage difference between the first half local I/O line pair LIO2_H1 and LIO2B_H1 or between the second half local I/O line pair LIO2_H2 and LIO2B_H2 in response to the local sense enable signal PLSAEN to provide the amplified voltage difference to the global I/O line pair GIO2 and GIO2B. The local sense amplifier circuit 700*a* controls connection between the global I/O line pair GIO2 and GIO2B and one of the first half local I/O line pair LIO2_H1 and LIO2B_H1 and the first half local I/O line pair LIO2_H2 and LIO2B_H2 in response to the first connection control signal PMUXON1 and the second connection control signal PMUXON2.

FIGS. 14A through 14E illustrate a semiconductor memory device performing a column repair, according to exemplary embodiments of the inventive concept.

In FIGS. 14A through 14E, it is assumed that the memory cell array 300 or 300*a* includes memory blocks MB1~MB4, and each of the memory blocks MB1~MB4 includes eight bit-lines, a first spare bit-line selected by a spare column selection line SCSL0, and a second spare bit-line selected by a spare column selection line SCSL1. In FIGS. 14A through 14E, × denotes a defective cell, a dashed arrow denotes an unused SCSL, and a solid arrow denotes a used SCSL.

Figure 14A:
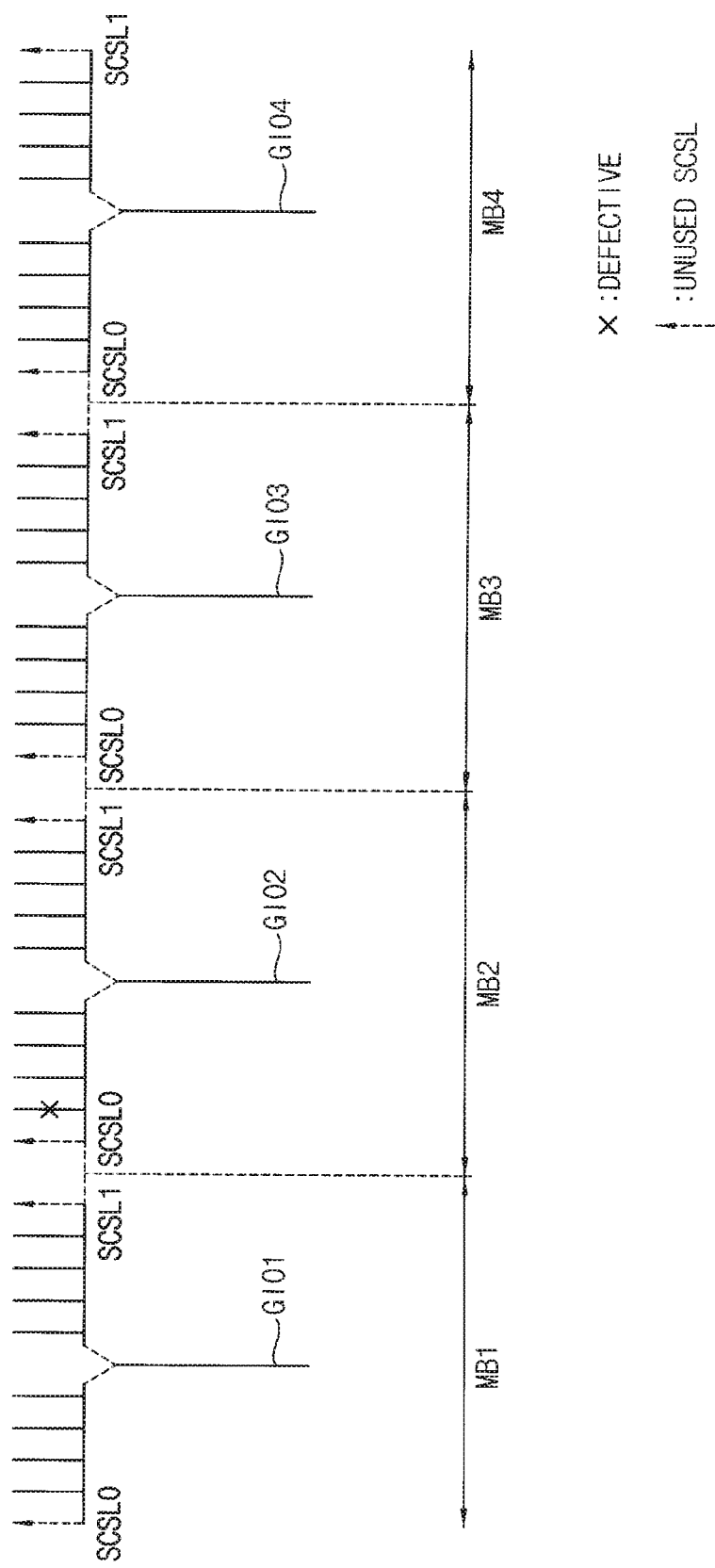

Referring to FIG. 14A, the memory block (a first memory block) MB2 includes a defective cell×selected by a column selection line CSL0.

Figure 14B:
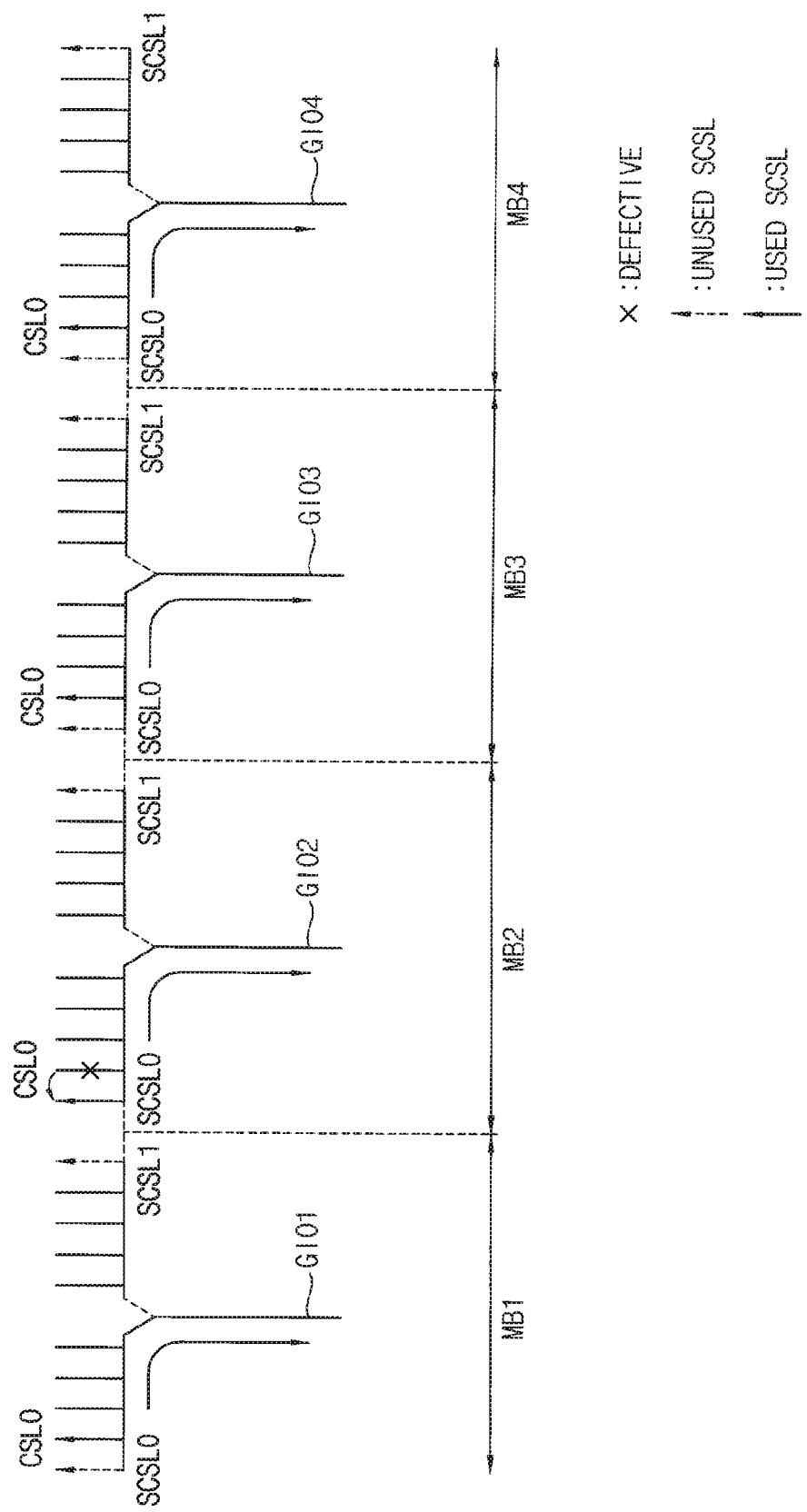

Referring to FIG. 14B, the column decoder 271 (in FIG. 5) repairs a first bit-line coupled to the defective cell in the first memory block MB2 with a first spare bit-line in the first memory block MB2. When the column selection line CSL0 is connected, four-bit data is output through global data lines GIO1~GIO4 of the memory blocks MB1~MB4.

Referring to FIG. 14C, the column decoder 271 repairs the first bit-line coupled to the defective cell in the first memory block MB2 with the second spare bit-line (selected by SCSL1) in the memory block (a second memory block) MB1 which is adjacent to the first memory block MB2 in a direction of the first half local I/O line as indicated by a reference numeral 731. In this case, the block switch between the first memory block MB2 and the second memory block MB1 connects a first half local I/O line in the first memory block MB2 and a second half local I/O line in the second memory block MB1. When the column selection line CSL0 is connected, four-bit data is output through the global data lines GIO1~GIO4 of the memory blocks MB1~MB4.

Referring to FIG. 14D, the column decoder 271 repairs the first bit-line coupled to the defected cell in the first memory block MB2 with the second spare bit-line (selected by SCSL1) in the memory block (a second memory block) MB3 which is adjacent to the first memory block MB2 in a direction of the second half local I/O line. The column decoder 271 replaces the defective cell with a normal cell in the second memory block MB3 as indicated by a reference numeral 741 and repairs the normal cell in the second memory block MB3 with the second spare bit-line (selected by SCSL1) in the second memory block MB3 as indicated by a reference numeral 742. In this case, the block switch between the first memory block MB2 and the second memory block MB3 connects a second half local I/O line in the first memory block MB2 and a first half local I/O line in the second memory block MB3. When the column selection line CSL0 is connected, four-bit data is output through the global data lines GIO1~GIO4 of the memory blocks MB1~MB4.

Referring to FIG. 14E, the column decoder 271 repairs the first bit-line coupled to the defective cell in the first memory block MB2 with the second spare bit-line (selected by SCSL1) in the memory block (a second memory block) MB3 which is adjacent to the first memory block MB2 in a direction of the second half local I/O line. The column decoder 271 replaces the defective cell with a normal cell in the second memory block MB3 as indicated by a reference numeral 751, replaces the normal cell in the second memory block MB3 with a normal cell in the memory block (a third memory block) MB4 as indicated by a reference numeral 752, and repairs the normal cell in the third memory block MB4 with the second spare bit-line (selected by SCSL1) in the third memory block MB4 as indicated by a reference numeral 753. In this case, the block switch between the first memory block MB2 and the second memory block MB3 connects the second half local I/O line in the first memory block MB2 and the first half local I/O line in the second memory block MB3, and the block switch between the second memory block MB3 and the third memory block MB4 connects a second half local I/O line in the second memory block MB3 and a first half local I/O line in the third memory block MB4. When the column selection line CSL0 is connected, four-bit data is output through the global data lines GIO1~GIO4 of the memory blocks MB1~MB4.

FIG. 15 illustrates a semiconductor memory device performing a column repair according to an exemplary embodiment of the inventive concept.

In FIG. 15, × denotes a defective cell, a dashed arrow denotes an unused SCSL, and a solid arrow denotes a used SCSL. In FIG. 15, it is assumed that first, second, and third bit-lines which are selected by column selection lines CL0, CSL1, and CSL4, respectively, are connected to defective cells in the first memory block MB2.

Referring to FIG. 15, the column decoder 271 repairs the first bit-line with a first spare bit-line in the first memory block MB2 as indicated by a reference numeral 761, repairs the second bit-line with a second spare bit-line in the first memory block MB2 as indicated by a reference numeral 762, and repairs the third bit-line with a first bit-line in the second memory block MB3 which is adjacent to the first memory block MB2 in a direction of a second half local I/O line as indicated by a reference numeral 763.

Figure 16:
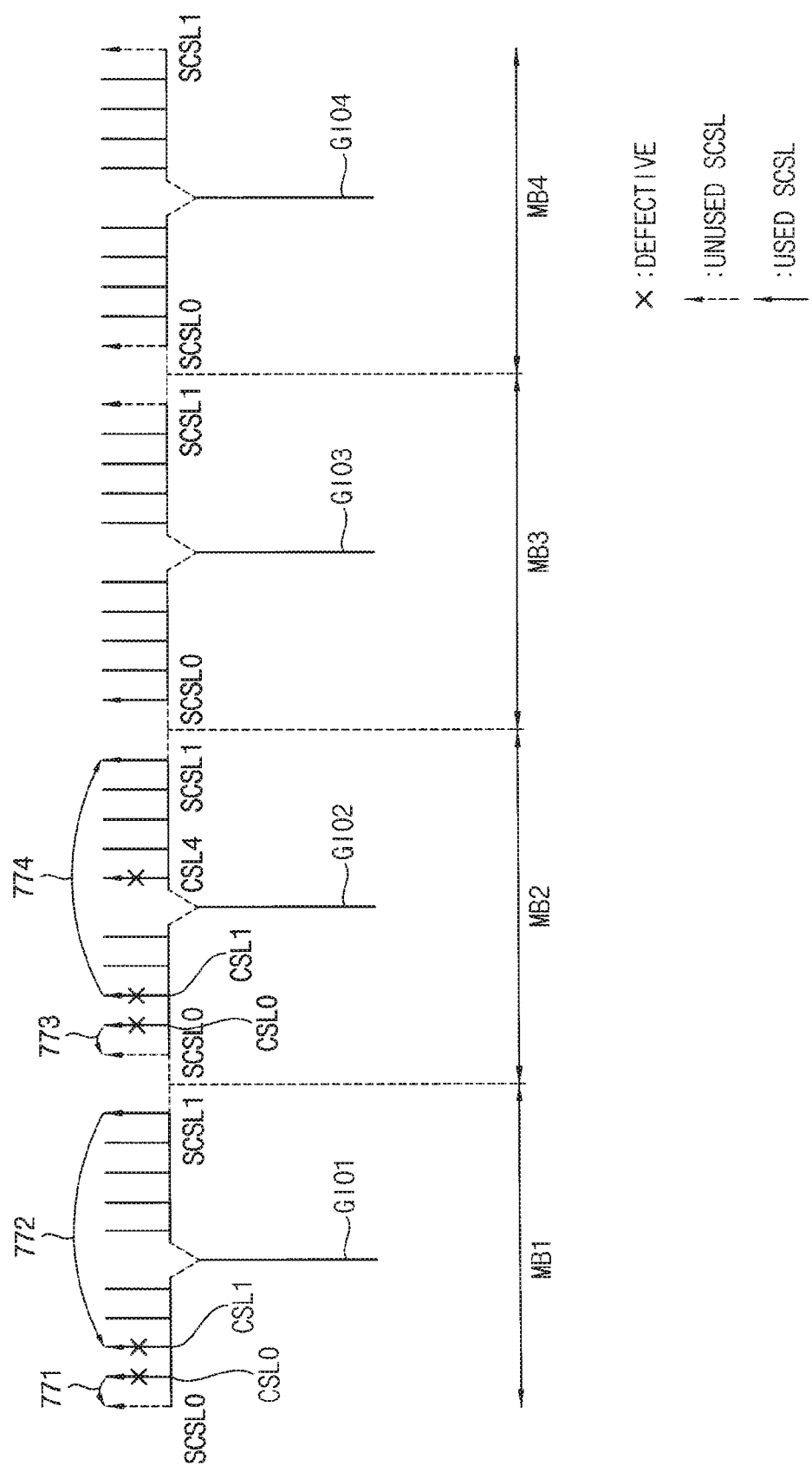
FIG. 16 illustrates a semiconductor memory device performing a column repair according to an exemplary embodiment of the inventive concept.

FIG. 16 illustrates a semiconductor memory device performing a column repair according to an exemplary embodiment of the inventive concept.

In FIG. 16, × denotes a defective cell, a dashed arrow denotes an unused SCSL, and a solid arrow denotes a used SCSL. In FIG. 16, it is assumed that first and second bit-lines which are selected by column selection lines CL0 and CSL1, respectively, are connected to defective cells in the each of the memory blocks MB1 and MB2.

Referring to FIG. 16, the column decoder 271 repairs a first bit-line in each of the memory blocks MB1 and MB2 with a first spare bit-line in each of the memory blocks MB1 and MB2, respectively, as indicated by reference numerals 771 and 773, and repairs a second bit-line in each of the memory blocks MB1 and MB2 with a second spare bit-line in each of the memory blocks MB1 and MB2, respectively, as indicated by reference numerals 772 and 774.

FIGS. 17A through 17E illustrate a semiconductor memory device performing a column repair, according to an exemplary embodiment of the inventive concept.

In FIGS. 17A through 17E, it is assumed that the memory cell array 300 or 300*a* includes memory blocks MB1~MB4, and each of the memory blocks MB1~MB4 includes eight bit-lines (represented by 0~7). In FIGS. 17A through 17E, × denotes a defective cell, a dashed arrow denotes an unused SCSL, and a solid arrow denotes a used SCSL.

Figure 17A:
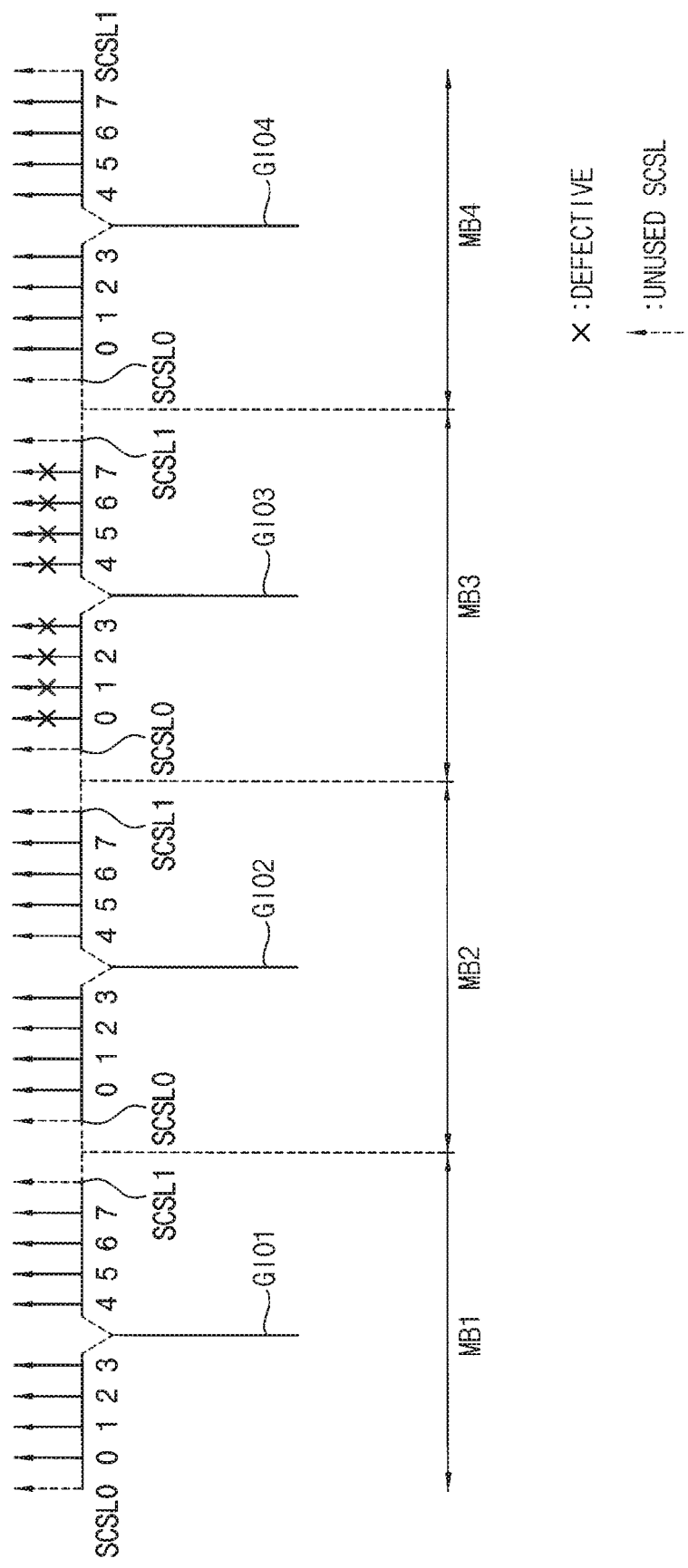

Referring to FIG. 17A, all bit-lines of the memory block MB3 are connected to defective cells.

Figure 17B:
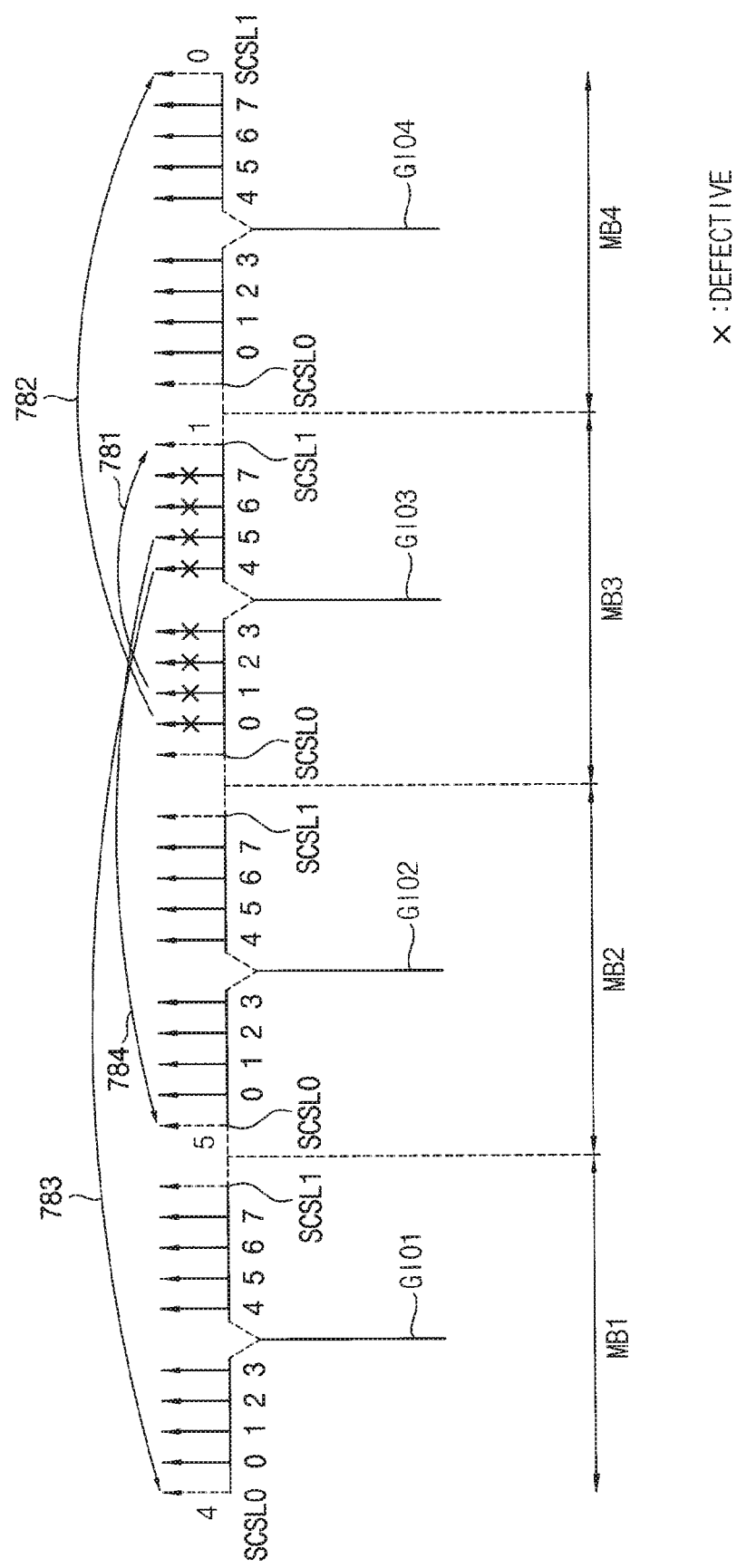

Referring to FIG. 17B, the column decoder 271 repairs a first bit-line in the memory block MB3 with a second spare bit-line (selected by SCSL1) in the adjacent memory block MB4 as indicated by a reference numeral 782, repairs a second bit-line in the memory block MB3 with a second spare bit-line in the memory block MB3 as indicated by a reference numeral 781, repairs a fifth bit-line in the memory block MB3 with a first spare bit-line (selected by SCSL0) in the memory block MB1 as indicated by a reference numeral 783, and repairs a sixth bit-line in the memory block MB3 with a first spare bit-line in the memory block MB2 as indicated by a reference numeral 784.

Referring to FIG. 17C, the column decoder 271 repairs a third bit-line in the memory block MB3 with a second spare bit-line in the memory block MB2 as indicated by a reference numeral 785 and repairs a seventh bit-line in the memory block MB3 with a first spare bit-line in the memory block MB4 as indicated by a reference numeral 786.

Referring to FIG. 17D, the column decoder 271 repairs a fourth bit-line in the memory block MB3 with a first spare bit-line in the memory block MB3 as indicated by a reference numeral 787.

Referring to FIG. 17E, the column decoder 271 repairs an eighth bit-line in the memory block MB3 with a second spare bit-line in the memory block MB1 as indicated by a reference numeral 788, and swaps a fourth bit-line in the memory block MB1 with an eighth bit-line in the memory block MB1 as indicated by a reference numeral 789.

Figure 18:
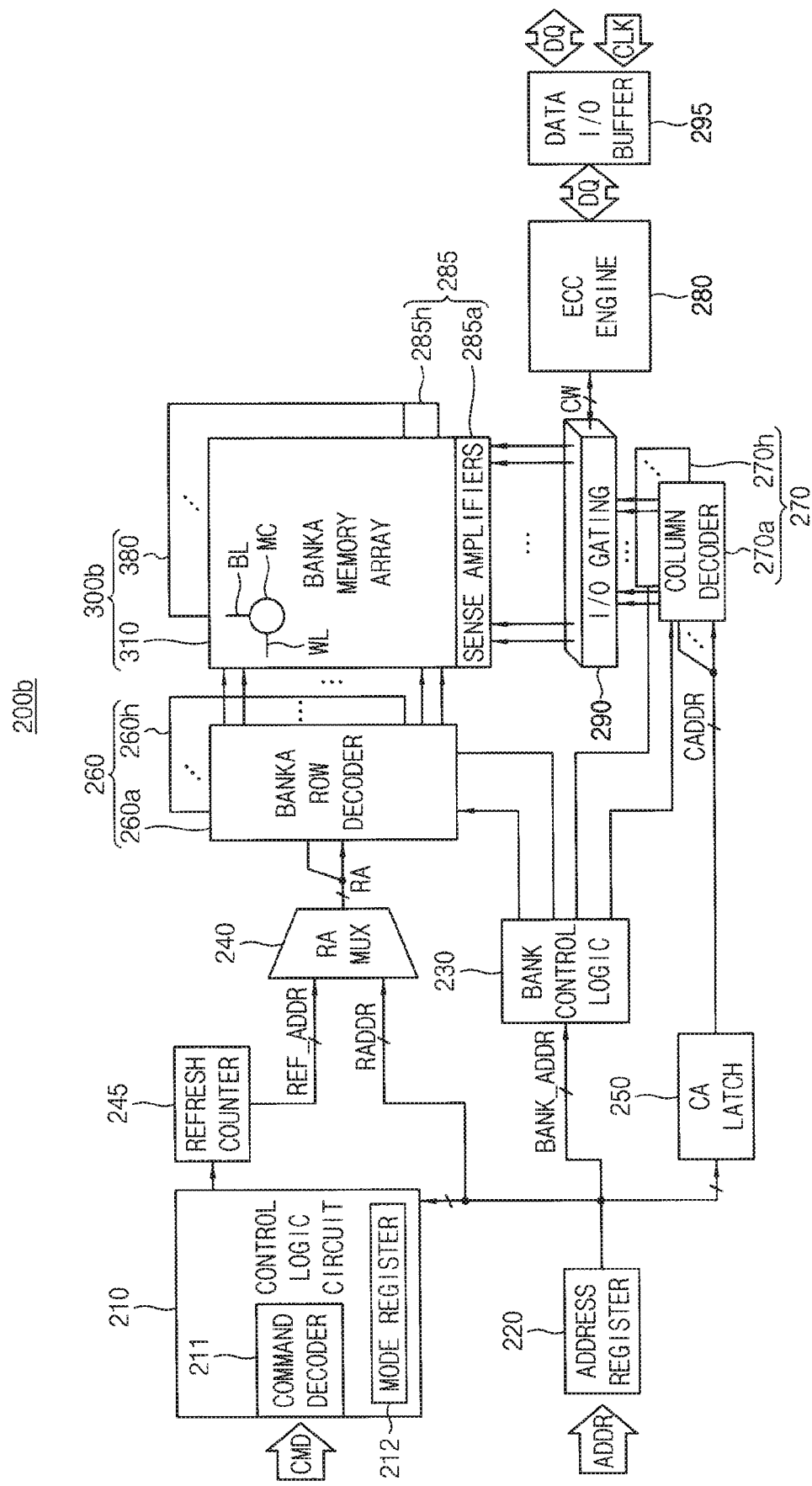
FIG. 18 is a block diagram illustrating the semiconductor memory device in FIG. 1 according to an exemplary embodiment of the inventive concept.

FIG. 18 is a block diagram illustrating the semiconductor memory device in FIG. 1 according to an exemplary embodiment of the inventive concept.

Referring to FIG. 18, a semiconductor memory device 200b includes a control logic circuit 210, an address register 220, a bank control logic 230, a refresh counter 245, a row address multiplexer 240, a column address latch 250, a row decoder 260, a column decoder 270, a memory cell array 300b, a sense amplifier unit 285, an input/output (I/O) gating circuit 290, an ECC engine 280, and a data I/O buffer 295.

The memory cell array 300b includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h, and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-lines BL.

The address register 220 receives the address ADDR including a bank address BANK_ADDR, a row address RADDR, and a column address CADDR from the memory controller 100. The address register 220 provides the received bank address BANK_ADDR to the bank control logic 230, provides the received row address RADDR to the row address multiplexer 240, and provides the received column address CADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address RADDR from the address register 220, and receives a refresh row address REF_ADDR from the refresh counter 245. The row address multiplexer 240 selectively outputs the row address RADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h, which is activated by the bank control logic 230, decodes the row address RA that is output from the row address multiplexer 240, and activates a word-line WL corresponding to the row address RA. For example, the activated bank row decoder applies a word-line driving voltage to the word-line WL corresponding to the row address RA. In addition, the activated bank row decoder activates a spare word-line corresponding to a spare row address SRA output from the row block information circuit 400 (e.g., see FIG. 3) of the activated bank row decoder substantially simultaneously with activating the word-line corresponding to the row address RA.

The column address latch 250 receives the column address CADDR from the address register 220, and temporarily stores the received column address CADDR. For example, the column address latch 250 may temporarily store the received column address CADDR in an internal memory of the column address latch 250. In exemplary embodiments of the inventive concept, in a burst mode, the column address latch 250 generates column addresses that increment from the received column address CADDR. The column address latch 250 applies the temporarily stored or generated column address CADDR to the first through eighth bank column decoders 270a~270h.

The activated one of the first through eighth bank column decoders 270a~270h activates a sense amplifier corresponding to the bank address BANK_ADDR and the column address CADDR through the I/O gating circuit 290. The I/O gating circuit 290 includes a circuitry for gating input/output data, and further includes read data latches for storing data that is output from the first through eighth bank arrays 310~380, and write drivers for writing data to the first through eighth bank arrays 310~380.

A codeword CW read from one bank array of the first through eighth bank arrays 310~380 is sensed by a sense amplifier coupled to the one bank array from which the data is to be read, and is stored in the read data latches of the I/O gating circuit 290. The codeword CW stored in the read data latches may be provided to the memory controller 100 via the data I/O buffer 295 after ECC decoding is performed on the codeword CW by the ECC engine 280. The data DQ to be written in one bank array of the first through eighth bank arrays 310~380 provided to the data I/O buffer 295 from the memory controller 100 is written in one bank array by the write drivers of the I/O gating circuit 290 after an ECC encoding is performed on the data DQ by the ECC engine 280.

The data I/O buffer 295 may provide the data DQ from the memory controller 100 to the ECC engine 280 in a write operation of the semiconductor memory device 200b based on the clock signal CLK, and may provide the data DQ from the ECC engine 280 to the memory controller 100 in a read operation of the semiconductor memory device 200b.

In the write operation, the ECC engine 280 may generate parity bits based on the data DQ from the data I/O buffer 295, and may provide the I/O gating circuit 290 with the codeword CW including the data DQ and the parity bits. The I/O gating circuit 290 may write the codeword CW in one bank array. In the read operation, the ECC engine 280 may receive the codeword CW, read from one bank array, from the I/O gating circuit 290. The ECC engine 280 may perform an ECC decoding on the data DQ based on the parity bits in the codeword CW, may correct at least one error bit in the data DQ, and may provide corrected data to the data I/O buffer 295.

The control logic circuit 210 may control operations of the semiconductor memory device 200b. For example, the control logic circuit 210 may generate control signals for the semiconductor memory device 200b to perform the write operation or the read operation. The control logic circuit 210 includes a command decoder 211 that decodes the command CMD received from the memory controller 100 and a mode register 212 that sets an operation mode of the semiconductor memory device 200b.

Each of the first through eighth bank arrays 310~380 may have a configuration which is substantially the same as the memory cell array 300a in FIG. 5 and each of the first through eighth bank column decoders 270a~270h may include repair circuits such as repair circuits 501~50I in FIG. 5.

Figure 19:
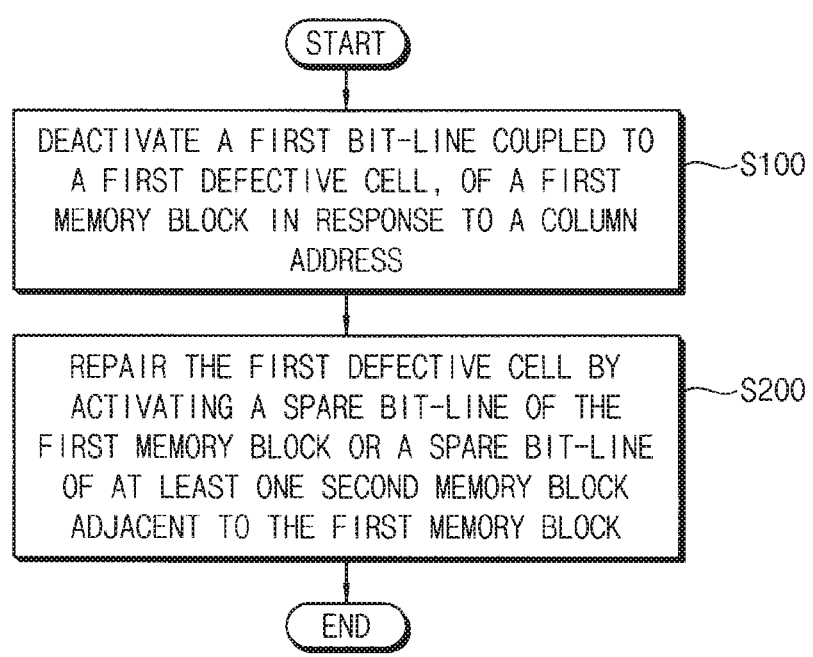
FIG. 19 is a flowchart illustrating a method of operating a semiconductor memory device according to an exemplary embodiment of the inventive concept.

FIG. 19 is a flowchart illustrating a method of operating a semiconductor memory device according to an exemplary embodiment of the inventive concept.

Referring to FIGS. 2A through 19, in a method of operating a semiconductor memory device 200, the semiconductor memory device 200 includes a memory cell array including a plurality of memory blocks coupled to at least one word-line, each of the plurality of memory blocks includes a plurality of dynamic memory cells, at least one bit-line switch coupled between a first half local input/output (I/O) line of a first memory block among the memory blocks and a second half local I/O line of the first memory block, and at least one block switch connected between the second half local I/O line of the first memory block and a first half local I/O line of a second memory block adjacent to the first memory block. The first half local I/O line of the first memory block is connected to a first group of bit-lines of a plurality of bit-lines of the first memory block, and the second half local I/O line is connected to a second group of bit-lines of the plurality of bit-lines. The column decoder 271 deactivates a first bit-line coupled to a defective cell of the first memory block, in response to a column address CADDR in operation S100. The column decoder 271 repairs the defective cell by controlling the at least one bit-line switch and the at least one block switch to activate a spare bit-line of the first memory block or a spare bit-line of the second memory block in operation S200.

The column decoder 271 may control a connection between the first half local I/O line of the first memory block and the second half local I/O line of the first memory block, and a connection between the second half local I/O line of the first memory block and the first half local I/O line of the second memory block by applying a first switching control signal to the at least one bit-line switch and by applying a second switching control signal to the at least one block switch for repairing the defective cell.

According to exemplary embodiments of the inventive concept, the semiconductor memory device 200 distributes redundancy resources in the memory blocks equally and may use a spare bit-line in an adjacent memory block by controlling bit-line switches and block switches. Therefore, the semiconductor memory device 200 which has a distributed redundancy architecture may enhance performance by increasing column repair flexibility and repairing block fail.

Figure 20:
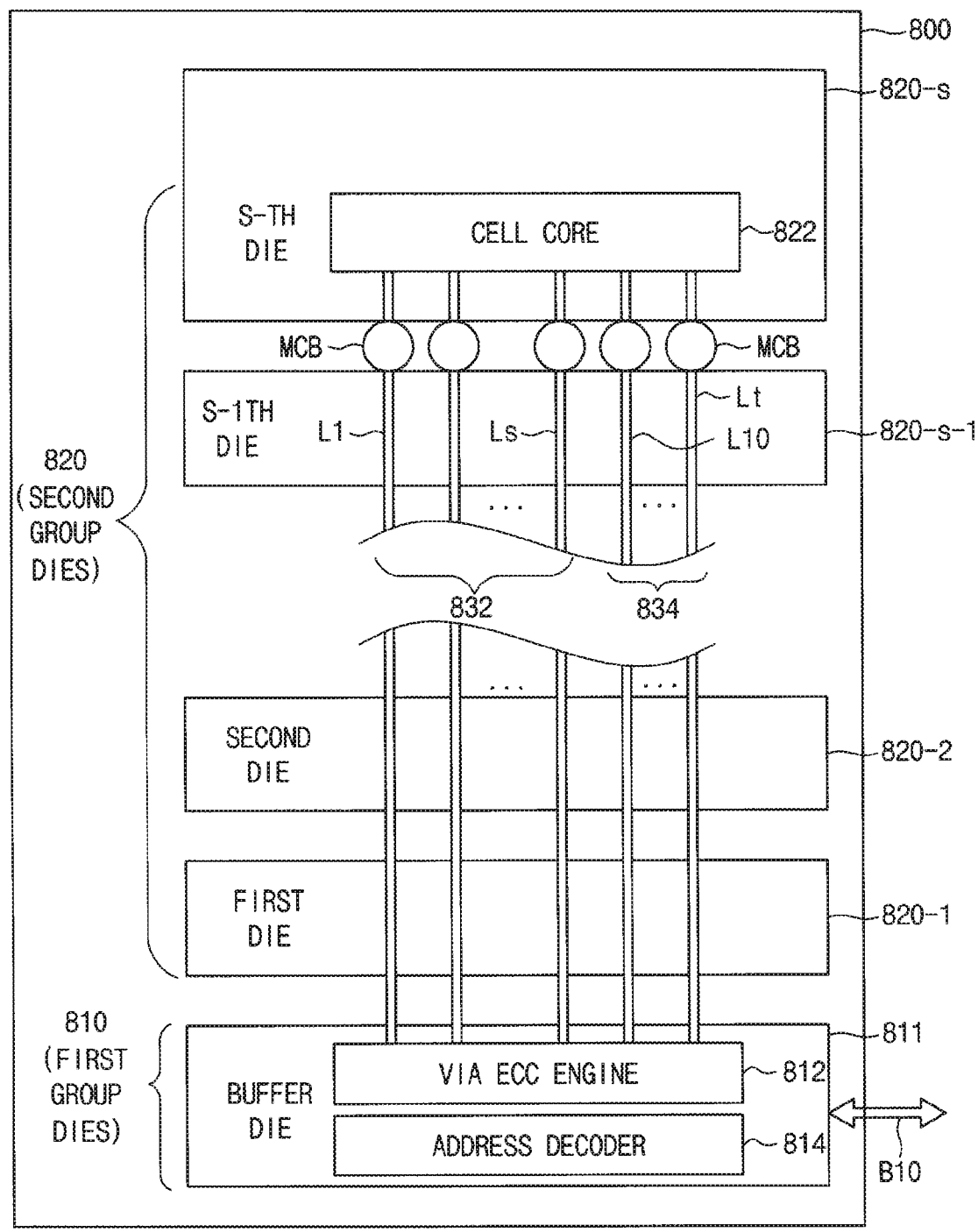
FIG. 20 is a block diagram illustrating a semiconductor memory device according to an exemplary embodiment of the inventive concept.

FIG. 20 is a block diagram illustrating a semiconductor memory device according to an exemplary embodiment of the inventive concept.

Referring to FIG. 19, a semiconductor memory device 800 may include first group dies 810 and second group dies 820.

The first group dies 810 may include at least one buffer die 811. The second group dies 820 may include a plurality of memory dies 820-1 to 820-s, which are stacked on the first group dies 810 and convey data through a plurality of through silicon via (TSV) lines extending from memory die 820-s, through intervening memory dies 820-s-1 to 820-1, to the first group dies 810.

Each of the memory dies 820-1 to 820-s may include a cell core 822, which includes memory blocks, and each of the memory blocks includes memory cells coupled to word-lines and bit-lines and spare cells coupled to the word-lines, a first spare bit-line, and a second spare bit-line. In addition, the cell core 822 includes the above-mentioned bit-line switches and block switches.

The buffer die 811 may include an ECC engine 812, which corrects a transmission error using transmission parity bits when a transmission error is detected from the transmission data received through the TSV lines and generates error-corrected data. The ECC engine 812 may be referred to as a "via ECC engine". The buffer die 811 may further include an address decoder 814 and the address decoder 814 may employ the row decoder 261 and the column decoder 271 in FIG. 3. The address decoder 814 may apply switching control signals to the cell core 822.

A data TSV line group 832 which is formed at one memory die 820-s may include a plurality of TSV lines L1 to Ls, and a parity TSV line group 834 may include a plurality of TSV lines L10 to Lt. The TSV lines L1 to Ls of the data TSV line group 832 and the parity TSV lines L10 to Lt of the parity TSV line group 834 may be connected to micro bumps MCB which are correspondingly formed among the memory dies 820-1 to 820-s.

Each of the memory dies 820-1 to 820-s may include DRAM cells each including at least one access transistor and one storage capacitor.

The semiconductor memory device 800 may have a three-dimensional (3D) chip structure or a 2.5D chip structure to communicate with a memory controller through a data bus B10. The buffer die 811 may be connected with the memory controller through the data bus B10.

The ECC engine 812, denoted as the via ECC engine, may determine whether a transmission error occurs in the transmission data received through the data TSV line group 832, based on the transmission parity bits received through the parity TSV line group 834. When a transmission error is detected, the ECC engine 812 may correct the transmission error in the transmission data using the transmission parity bits. When the transmission error is uncorrectable, the ECC engine 812 may output information indicating occurrence of an uncorrectable data error.

Figure 21:
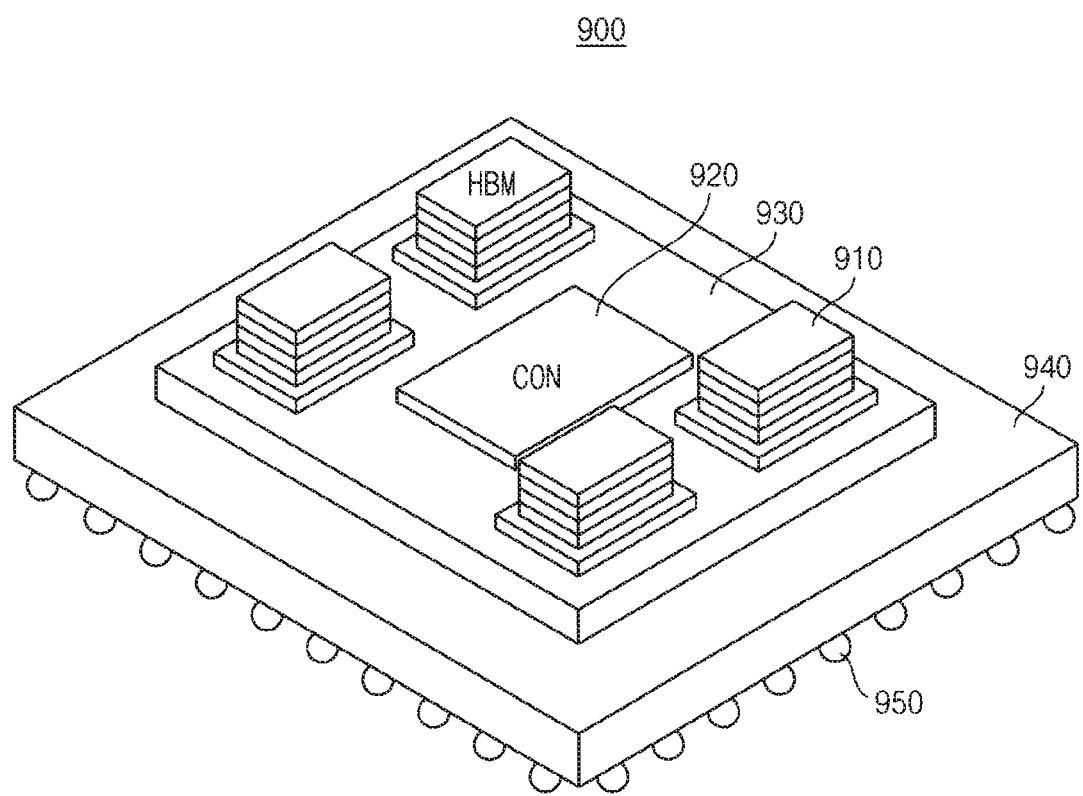
FIG. 21 is a diagram illustrating a semiconductor package including a stacked memory device according to an exemplary embodiment of the inventive concept.

FIG. 21 is a diagram illustrating a semiconductor package including a stacked memory device according to an exemplary embodiment of the inventive concept.

Referring to FIG. 20, a semiconductor package 900 may include one or more stacked memory devices 910 and a memory controller 920. The stacked memory devices 910 and the memory controller 920 may be mounted on an interposer 930, and the interposer 930 on which the stacked memory devices 910 and the memory controller 920 are mounted may be mounted on a package substrate 940. In exemplary embodiments of the inventive concept, one of the stacked memory devices 910 may employ the semiconductor memory device 800 in FIG. 20 and the memory controller 920 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies.

As described above, the stacked memory devices 910 may be mounted on the interposer 930, and the memory controller 920 may communicate with the stacked memory devices 910. For example, each of the stacked memory devices 910 and the memory controller 920 may include a physical region, and communication may be performed between the stacked memory devices 910 and the memory controller 920 through the physical region. Meanwhile, when each of the stacked memory devices 910 includes a direct access region, a test signal may be provided to each of the stacked memory devices 910 through conductive means (e.g., solder balls 950) mounted under the package substrate 940 and the direct access region.

Exemplary embodiments of the inventive concept may be applied to systems using semiconductor memory devices.

As described above, according to exemplary embodiments of the inventive concept, the semiconductor memory device distributes redundancy resources in memory blocks equally and may use a spare bit-line in an adjacent memory block by controlling bit-line switches and block switches. Therefore, the semiconductor memory device which has a distributed redundancy architecture may enhance performance by increasing column repair flexibility and repairing block fail.

While the inventive concept has been shown and described with reference to exemplary embodiments thereof, it will be apparent to those of ordinary skill in the art that various modifications in form and details may be made thereto without departing from the spirit and scope of the inventive concept as set forth by the appended claims.

What is claimed is:

1. A semiconductor memory device comprising:
a memory cell array including a plurality of memory blocks coupled to at least one word-line, wherein each of the plurality of memory blocks includes a plurality of dynamic memory cells;
at least one bit-line switch connected between a first half local input/output (I/O) line of a first memory block of the plurality of memory blocks and a second half local I/O line of the first memory block, wherein the first half local I/O line of the first memory block is connected to a first group of bit-lines of a plurality of bit-lines of the first memory block, and the second half local I/O line of the first memory block is connected to a second group of bit-lines of the plurality of bit-lines;
at least one block switch connected between the second half local I/O line of the first memory block and a first half local I/O line of a second memory block among the plurality of memory blocks, wherein the first memory block and the second memory block are adjacent to each other; and
a column decoder including a repair circuit, wherein the repair circuit is configured to control a connection between the first half local I/O line of the first memory block and the second half local I/O line of the first memory block by applying a first switching control signal to the at least one bit-line switch, and is configured to control a connection between the second half local I/O line of the first memory block and the first half local I/O line of the second memory block by applying a second switching control signal to the at least one block switch,
wherein
the first group of bit-lines includes at least a first spare bit-line coupled to first spare cells among the plurality of dynamic memory cells,
the second group of bit-lines includes at least a second spare bit-line coupled to second spare cells among the plurality of dynamic memory cells,
the first group of bit-lines are connected to the first half local I/O line of the first memory block through first bit-line sense amplifiers,
the second group of bit-lines are connected to the second half local I/O line of the first memory block through second bit-line sense amplifiers, and
the first bit-line sense amplifiers are connected between the first group of bit-lines and the first half local I/O line, and the second bit-line sense amplifiers are connected between the second group of bit-lines and the second half local I/O line.

2. The semiconductor memory device of claim 1, further comprising a local sense amplifier circuit corresponding to the first memory block,
wherein the local sense amplifier circuit is connected to the first half local I/O line of the first memory block and the second half local I/O line of the first memory block through the at least one bit-line switch, and
wherein the local sense amplifier circuit is connected to a global I/O line.

3. The semiconductor memory device of claim 1, wherein the repair circuit is configured to connect the second half local I/O line of the first memory block and the first half local I/O line of the second memory block by applying the second switching control signal to the at least one block switch.

4. The semiconductor memory device of claim 3, wherein if the second half local I/O line of the first memory block and the first half local I/O line of the second memory block are connected to each other, at least one spare bit-line of the second memory block is connected to a local sense amplifier circuit corresponding to the first memory block.

5. The semiconductor memory device of claim 1, wherein the at least one bit-line switch includes:
a first bit-line switch connected between the first half local I/O line of the first memory block and a first node; and
a second bit-line switch connected between the first node and the second half local I/O line of the first memory block.

6. The semiconductor memory device of claim 5, wherein the repair circuit is configured to apply the first switching control signal to the first bit-line switch and is configured to apply an inverted version of the first switching control signal to the second bit-line switch.

7. A semiconductor memory device comprising:
a memory cell array including a plurality of memory blocks coupled to at least one word-line, wherein each of the plurality of memory blocks includes a plurality of dynamic memory cells;
at least one bit-line switch coupled between a first half local input/output (I/O) line of a first memory block of the plurality of memory blocks and a second half local I/O line of the first memory block, wherein the first half local I/O line of the first memory block is connected to a first group of bit-lines of a plurality of bit-lines of the first memory block, and the second half local I/O line of the first memory block is connected to a second group of bit-lines of the plurality of bit-lines;
at least one block switch connected between the second half local I/O line of the first memory block and a first half local I/O line of a second memory block among the plurality of memory blocks, wherein the first memory block and the second memory block are adjacent to each other; and
a column decoder configured to repair a first bit-line of the first memory block with at least one spare bit-line of the first memory block or with a spare bit-line of a memory block adjacent to the first memory block by controlling the at least one bit-line switch and the at least one block switch,
wherein
the first bit-line is coupled to a defective cell of the plurality of dynamic memory cells,
the first group of bit-lines includes at least a first spare bit-line coupled to first spare cells among the plurality of dynamic memory cells,
the second group of bit-lines includes at least a second spare bit-line coupled to second spare cells among the plurality of dynamic memory cells, and
if a second bit-line and a third bit-line are connected to defective cells, the column decoder is configured to:
repair the first bit-line with the first spare bit-line of the first memory block;
repair the second-bit-line with the second spare bit-line of the first memory block; and
repair the third bit-line with a first spare bit-line of the second memory block which is adjacent to the first memory block in a direction of the second half local I/O line of the first memory block.

8. The semiconductor memory device of claim 7, wherein the column decoder includes a repair circuit, and
wherein the repair circuit is configured to control a connection between the first half local I/O line of the first memory block and the second half local I/O line of the first memory block by applying a first switching control signal to the at least one bit-line switch and is configured to control a connection between the second half local I/O line of the first memory block and the first half local I/O line of the second memory block by applying a second switching control signal to the at least one block switch.

9. The semiconductor memory device of claim 7, wherein the column decoder is configured to repair the first bit-line of the first memory block with the first spare bit-line of the first memory block.

10. The semiconductor memory device of claim 7, wherein the column decoder is configured to repair the first bit-line of the first memory block with a second spare bit-line of a third memory block which is adjacent to the first memory block in a direction of the first half local I/O line of the first memory block.

11. The semiconductor memory device of claim 7, wherein the column decoder is configured to repair the first bit-line of the first memory block with a second spare bit-line of the second memory block which is adjacent to the first memory block in a direction of the second half local I/O line of the first memory block.

12. The semiconductor memory device of claim 7, wherein the column decoder is configured to repair the first bit-line of the first memory block with a second spare bit-line of a third memory block which is adjacent to the second memory block in a direction of the second half local I/O line of the first memory block, and
wherein the second memory block is adjacent to the first memory block in a direction of the second half local I/O line of the first memory block.

13. The semiconductor memory device of claim 7, wherein if four or more bit-lines of the first memory block are connected to defective cells, the column decoder is configured to repair the four or more bit-lines with spare bit-lines of the first memory block, the second memory block, a third memory block, and a fourth memory block,
wherein the second memory block is adjacent to the first memory block in a direction of the second half local I/O line of the first memory block,
wherein the third memory block is adjacent to the first memory block in a direction of the first half local I/O line of the first memory block, and
wherein the fourth memory block is adjacent to the third memory block in a direction of the first half local I/O line of the first memory block.

14. A semiconductor memory device comprising:
a memory cell array including a plurality of memory blocks coupled to at least one word-line, wherein each of the plurality of memory blocks includes a plurality of dynamic memory cells;
at least one bit-line switch coupled between a first half local input/output (I/O) line of a first memory block of the plurality of memory blocks and a second half local I/O line of the first memory block, wherein the first half local I/O line of the first memory block is connected to a first group of bit-lines of a plurality of bit-lines of the first memory block, and the second half local I/O line of the first memory block is connected to a second group of bit-lines of the plurality of bit-lines;
at least one block switch connected between the second half local I/O line of the first memory block and a first half local I/O line of a second memory block among the plurality of memory blocks, wherein the first memory block and the second memory block are adjacent to each other; and
a column decoder configured to repair a first bit-line of the first memory block with at least one spare bit-line of the first memory block or with a spare bit-line of a memory block adjacent to the first memory block by controlling the at least one bit-line switch and the at least one block switch,
wherein
the first bit-line is coupled to a defective cell of the plurality of dynamic memory cells,
the first group of bit-lines includes at least a first spare bit-line coupled to first spare cells among the plurality of dynamic memory cells,
the second group of bit-lines includes at least a second spare bit-line coupled to second spare cells among the plurality of dynamic memory cells, and
if the first bit-line of the first memory block, a second bit-line of the first memory block, a first bit-line of the second memory block, and a second bit-line of the second memory block are connected to defective cells, the column decoder is configured to:

repair the first bit-line of the first memory block with the first spare bit-line of the first memory block;

repair the second bit-line of the first memory block with the second spare bit-line of the first memory block;

repair the first bit-line of the second memory block with a first spare bit-line of the second memory block; and repair the second bit-line of the second memory block with a second spare bit-line of the second memory block.

* * * * *